United States Patent
Hoogkamp et al.

(10) Patent No.: US 9,500,953 B2
(45) Date of Patent: Nov. 22, 2016

(54) RADIATION SOURCE

(71) Applicant: ASML Netherlands B.V., Veldhoven (NL)

(72) Inventors: Jan Frederik Hoogkamp, Breda (NL); Bastiaan Stephanus Hendricus Jansen, Waalre (NL); Maurice Willem Jozef Etiënne Wijckmans, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 117 days.

(21) Appl. No.: 14/361,145

(22) PCT Filed: Nov. 2, 2012

(86) PCT No.: PCT/EP2012/071688
§ 371 (c)(1),
(2) Date: May 28, 2014

(87) PCT Pub. No.: WO2013/083335
PCT Pub. Date: Jun. 13, 2013

(65) Prior Publication Data
US 2014/0333915 A1    Nov. 13, 2014

Related U.S. Application Data

(60) Provisional application No. 61/567,436, filed on Dec. 6, 2011, provisional application No. 61/702,481, filed on Sep. 18, 2012.

(51) Int. Cl.
*G03B 27/54* (2006.01)
*G03B 27/72* (2006.01)
(Continued)

(52) U.S. Cl.
CPC ......... *G03F 7/70033* (2013.01); *G03F 7/7085* (2013.01); *G03F 7/70141* (2013.01);
(Continued)

(58) Field of Classification Search
CPC ........... G03F 7/70033; G03F 7/70141; G03F 7/70175; G03F 7/7085; H01J 37/32339; H01J 2237/04; H01J 2237/327; H05G 2/001; H05G 2/005; H05G 2/008
USPC ........... 250/492.1–493.1, 504 R; 355/67, 68, 355/71, 77
See application file for complete search history.

(56) References Cited

U.S. PATENT DOCUMENTS 8,242,472 B2    8/2012  Moriya et al.
2005/0205810 A1    9/2005  Akins et al.
(Continued)

FOREIGN PATENT DOCUMENTS

| JP | 2007528607 | 10/2007 |
|---|---|---|
| JP | 2008283107 | 11/2008 |
| JP | 2010135769 | 6/2010 |

OTHER PUBLICATIONS

International Search Report directed to related International Patent Application No. PCT/EP2012/071688, mailed Jul. 18, 2013; 4 pages.
(Continued)

*Primary Examiner* — Colin Kreutzer
(74) *Attorney, Agent, or Firm* — Sterne, Kessler, Goldstein & Fox P.L.L.C

(57) ABSTRACT

A radiation source (SO) suitable for providing a beam of radiation to an illuminator of a lithographic apparatus. The radiation source comprises a nozzle (128) configured to direct a stream of fuel droplets along a trajectory (140) towards a plasma formation location (212). The radiation source is configured to receive a first amount of radiation (205) such that, in use, the first amount of radiation is incident on a fuel droplet at the plasma formation location. The first amount of radiation transfers energy to the fuel droplet to generate a radiation generating plasma that emits a second amount of radiation (132). The radiation source further comprises an alignment detector having a first sensor arrangement (122) and a second sensor arrangement (134). The first sensor arrangement is configured to measure a property of a third amount of radiation (205a) that is indicative of a focus position of the first amount of radiation. The second sensor arrangement is configured to measure a property of a fourth amount of radiation (138), the fourth amount of radiation being a portion of the first amount of radiation that is reflected by the fuel droplet upon which the first amount of radiation is incident.

29 Claims, 16 Drawing Sheets

(51) Int. Cl.
  *G03B 27/74* (2006.01)
  *G03F 7/20* (2006.01)
  *H01J 37/32* (2006.01)
  *H05G 2/00* (2006.01)

(52) U.S. Cl.
  CPC ..... *G03F 7/70175* (2013.01); *H01J 37/32339* (2013.01); *H01J 2237/04* (2013.01); *H01J 2237/327* (2013.01); *H05G 2/005* (2013.01); *H05G 2/008* (2013.01)

(56) References Cited

U.S. PATENT DOCUMENTS

2010/0140512 A1   6/2010   Suganuma et al.
2010/0258750 A1*  10/2010  Partlo ............... H05G 2/003
                                                    250/504 R
2011/0140008 A1   6/2011   Bergstedt et al.

OTHER PUBLICATIONS

International Preliminary Report on Patentability and Written Opinion of the International Searching Authority directed to related International Patent Application No. PCT/EP2012/071688, issued Jun. 10, 2014; 9 pages.

English-language abstract for Japanese Patent Publication No. 2007528607 A; 10 pages.

English-language abstract for Japanese Patent Publication No. 2008283107 A; 2 pages.

* cited by examiner

ND SOURCE

CROSS-REFERENCE TO RELATED FIELDS

This application claims the benefit of U.S. provisional applications 61/567,436 and 61/702,481, which were filed on 6 Dec. 2011 and 18 Sep. 2012 respectively, and both of which are incorporated herein in their entirety by reference.

FIELD

The present invention relates to a radiation source, a lithographic apparatus and a method of operating a radiation source.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm, for example within the range of 5-10 nm such as 6.7 nm or 6.8 nm. Possible sources include, for example, laser-produced plasma sources, discharge plasma sources, or sources based on synchrotron radiation provided by an electron storage ring.

EUV radiation may be produced using a plasma. A radiation source for producing EUV radiation may include a laser for exciting a fuel to provide the plasma, and a source collector module for containing the plasma. The plasma may be created, for example, by directing a laser beam at a fuel, such as particles of a suitable material (e.g., tin), or a stream of a suitable gas or vapor, such as Xe gas or Li vapor. The laser beam that is directed at the fuel may be an Infra Red (IR) laser (i.e., a laser that emits radiation at an IR wavelength), such as a Carbon Dioxide ($CO_2$) laser or a Yttrium Aluminium Garnet (YAG) laser. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

As discussed above, within LPP sources radiation is directed at a fuel. The properties of the radiation that is output by the radiation producing plasma depend upon the alignment between the fuel and the focus of the radiation that is directed at the fuel. For example, two properties of the radiation output by the radiation producing plasma that are affected by the alignment between the fuel and the focus of the radiation directed at the fuel are the total intensity and the intensity distribution of the radiation output by the radiation producing plasma. It will be appreciated that in certain applications of the radiation source it is beneficial for the intensity distribution of the radiation output by the radiation producing plasma to be substantially uniform. Furthermore, certain lithographic apparatus may require a particular intensity distribution of radiation is produced by the radiation source and it is desirable that such an intensity distribution is reproducible. Moreover, in some applications it is desirable to for the radiation producing plasma to output the maximum possible total intensity of radiation. For these reasons at least, it is desirable to have some indication of the relative alignment between the fuel and the focus of the radiation directed at the fuel.

The ability to have some indication of the relative alignment between the fuel and the focus of the radiation directed at the fuel may be beneficial due to the fact that it may be desirable to control the LPP source so that the radiation output from the radiation source has a desired distribution. Alternatively, or in addition, it may be desirable to have an indication of the relative alignment between the fuel and the focus of the radiation directed at the fuel due to the fact that both the position of the fuel and the position of the focus of the radiation directed at the fuel may be subject to external disturbances. For example, the focus position of the radiation directed at the fuel and the position of the fuel (and hence the alignment between the fuel and the focus of the radiation directed at the fuel) may be affected by system dynamics of the lithographic apparatus, such as the movement of parts of the lithographic apparatus. The ability to have an indication of the relative alignment between the fuel and the focus of the radiation directed at the fuel means that any misalignment between the fuel and the focus of the radiation directed at the fuel can be corrected.

In some known lithographic apparatus, the relative alignment between the fuel and the focus of the radiation directed at the fuel is measured indirectly. For example, a sensor referred to as a quad sensor may be used to measure the intensity distribution of the radiation output by the radiation producing plasma. By measuring the intensity distribution of the radiation output by the radiation producing plasma, it is possible to infer information about the relative alignment between the fuel (that produced the radiation producing plasma) and the focus of the radiation directed at the fuel. The quad sensor has a plurality of sensor elements (for example 3 or 4), which are located within the radiation source and that may, for example, be equi-angularly spaced about an optical axis of the radiation output by the radiation producing plasma. By measuring the intensity of the radiation output by the radiation producing plasma, which is incident on each sensor element, it is possible to determine the intensity distribution of the radiation output by the radiation producing plasma. As previously discussed, by measuring the intensity distribution of the radiation output by the radiation producing plasma, it is possible to infer information about the relative alignment between the fuel and the focus of the radiation directed at the fuel. This information relating to the relative alignment between the fuel and the focus of the radiation directed at the fuel may be used to correct any misalignment between the fuel and the focus of the radiation directed at the fuel.

There are various problems associated with this method of determining information about the relative alignment between the fuel and the focus of the radiation directed at the fuel. These problems are discussed below.

First, due to the fact that information about the relative alignment between the fuel and the focus of the radiation directed at the fuel is obtained by measuring properties of the radiation output by the radiation producing plasma, the determination of the information concerning the alignment between the fuel and the focus of the radiation directed at the fuel is dependent upon the interaction between the fuel and the radiation, which is incident on the fuel, as well as the physics governing the generation of the radiation producing plasma and the physics governing the nature of the plasma itself.

The specifics of the interaction between the fuel and the radiation incident on the fuel, and also the properties of the radiation producing plasma, are not well known. For this reason, it is not possible to predict with absolute certainty what the alignment between the fuel and the focus of the radiation directed at the fuel based on measuring properties of the radiation output by the radiation producing plasma. Furthermore, due to the properties of the radiation producing plasma, for any given alignment between the fuel and the focus of the radiation directed at the fuel, the measured intensity/intensity distribution of the radiation output by the radiation producing plasma may be time-varying. Furthermore, the relationship between the alignment between the fuel and the focus of the radiation directed at the fuel and the measured intensity/intensity distribution of the radiation output by the radiation producing plasma may be non-linear. For this reason, measuring the properties of the radiation output by the radiation producing plasma makes it difficult to predict the relative alignment between the fuel and the focus of the radiation directed at the fuel with a high degree of accuracy. Moreover, properties of the radiation that is directed at the fuel may not be constant. Consequently, the measured properties of the radiation output by the radiation producing plasma may vary due to factors that are independent of the relative alignment between the fuel and the focus of the radiation directed at the fuel (such as changing properties of the radiation directed at the fuel).

The lack of accuracy in being able to determine the relative alignment between the fuel and the focus of the radiation directed at the fuel may make such a system for determining the relative alignment between the focus and the fuel unsuitable for high bandwidth control (i.e., control loops that operate at a high frequency).

Secondly, determining information regarding the relative alignment between the fuel and the focus of the radiation directed at the fuel by measuring a property of the radiation output by the radiation producing plasma requires that the radiation producing plasma is producing radiation, a property of which can be measured. When there is no output radiation being generated by the plasma (for example, if the fuel has not yet had radiation incident upon it) then it will not be possible to measure any property of radiation output by the radiation producing plasma, and as such it will not be possible to infer any information about the relative alignment between the fuel and the focus of the radiation directed at the fuel. This may lead to additional start-up and/or recovery time for a lithographic apparatus, which includes a radiation source that operates in this manner. Any additional start-up and/or recovery time of the lithographic apparatus is time in which the lithographic apparatus is not producing a product, and hence this reduces the output efficiency of the lithographic apparatus.

Thirdly, the sensing elements of the quad sensor that is used to measure properties of the radiation output of the radiation producing plasma are exposed to the radiation output by the radiation producing plasma. This may be disadvantageous in a situation whereby the radiation output by the radiation producing plasma is detrimental to the sensing elements of the quad sensor. For example, in the case where the radiation output by the radiation producing plasma is EUV radiation, the EUV radiation may damage the sensing elements of the quad sensor over time, thereby causing the quad sensor to degrade. Furthermore, the quad sensor may be located at a position that is in proximity to the radiation producing plasma. Consequently the quad sensor may be exposed to heat and/or debris from the radiation producing plasma that may damage or degrade the quad sensor. The damage or degradation of the quad sensor over time may cause the sensing characteristics of the quad sensor to vary over time such that the output of the quad sensor becomes either inaccurate or incapable of producing useful information about the relative alignment between the fuel and the focus of the radiation directed at the fuel. Furthermore, in extreme circumstances, the quad sensor may be damaged or degrade to the extent that it is no longer operable.

Some lithographic apparatus may have a radiation source that functions differently to that previously described. In these cases, the production of output radiation from a fuel is a two-step process. The first step is that a first pulse of radiation is directed at the fuel such that the first amount of radiation is incident on the fuel, and converts the fuel into a modified fuel distribution. For example, the modified fuel distribution may be a cloud of partially plasmarised fuel. A subsequent amount of radiation may be directed at the modified fuel distribution such that the subsequent amount of radiation is incident on the modified fuel distribution, causing the modified fuel distribution to become a radiation producing plasma, which outputs the desired radiation.

The first amount of radiation incident on the fuel may be referred to as a pre-pulse and the subsequent amount of radiation incident on the modified fuel distribution may be referred to as a main-pulse.

In cases involving a pre-pulse and a main-pulse, both the relative alignment between the focus of the pre-pulse and the fuel, and the relative alignment between the focus of the main-pulse and the modified fuel distribution may be important in determining properties of the radiation output by the radiation producing plasma (for example, the intensity or the intensity distribution of the radiation output by the radiation producing plasma). Furthermore, it is thought that because the size of the fuel upon which the pre-pulse is incident is small compared to the size of the modified fuel distribution upon which the main-pulse is incident, it is likely that it is the relative alignment between the focus of the pre-pulse and the fuel that will be more critical than the alignment between the focus of the main-pulse and the modified fuel distribution to the properties of the radiation that is output by the radiation producing plasma.

However, as previously discussed, due to the fact that the pre-pulse radiation that is incident on the fuel will not create a radiation producing plasma, very little or no radiation will be produced as a result of the pre-pulse being incident on the fuel. Consequently, very little or no radiation will be measured by the quad sensor and hence the quad sensor may not be capable of providing any information about the relative alignment between the focus of the pre-pulse and the fuel. Furthermore, due to the fact that the properties of the modified fuel distribution are not well understood, it may not be possible to determine information about the relative alignment between the focus of the main-pulse and the modified fuel distribution by measuring the intensity distribution of the output radiation produced by the radiation producing plasma.

It is desirable to provide a radiation source that obviates or mitigates at least one of the problems of the prior art whether described above or otherwise. It is also desirable to provide an alternative radiation source.

SUMMARY

According to a first aspect of the invention, there is provided a radiation source suitable for providing a beam of radiation to an illuminator of a lithographic apparatus, the radiation source comprising a nozzle configured to direct a stream of fuel droplets along a trajectory towards a plasma formation location; the radiation source being configured to receive a first amount of radiation such that, in use, the first amount of radiation is incident on a fuel droplet at the plasma formation location; the radiation source further comprising an alignment detector having a first sensor arrangement and a second sensor arrangement; the first sensor arrangement being configured to measure a property of a third amount of radiation that is indicative of a focus position of the first amount of radiation; and the second sensor arrangement being configured to measure a property of a fourth amount of radiation, the fourth amount of radiation being a portion of the first amount of radiation that is reflected by the fuel droplet upon which the first amount of radiation is incident.

Throughout the description, except where otherwise described, the plasma formation location may be the location at which a pre-pulse is incident on the fuel droplet, or the location at which a main-pulse is incident on the fuel droplet (sometimes referred to herein as a modified fuel distribution).

The property of the fourth amount of radiation measured by the second sensor arrangement may be indicative of a position of the fuel droplet.

The alignment detector may comprise a beam splitting apparatus, and wherein the radiation source may be configured such that at least part of the first amount of radiation is incident on at least part of the beam splitting apparatus; the beam splitting apparatus being configured to direct at least a portion of said at least part of the first amount of radiation so that the at least a portion of said at least part of the first amount of radiation is incident on the first sensor arrangement; and wherein the at least a portion of said at least part of the first amount of radiation that is directed by the beam splitter apparatus so that it is incident on the first sensor arrangement is the third amount of radiation; and wherein the radiation source is configured such that at least part of the fourth amount of radiation is incident on at least part of the beam splitting apparatus; the beam splitting apparatus being configured to direct at least a portion of said at least part of the fourth amount of radiation so that the at least a portion of said at least part of the fourth amount of radiation is incident on the second sensor arrangement.

The beam splitting apparatus may be a beam splitter or comprises a beam splitter.

The radiation source may be configured such that at a beam splitting position, the beam splitting apparatus both: changes a direction of propagation of the at least a portion of the at least part of the first amount of radiation such that the at least a portion of the at least part of the first amount of radiation is incident on the first sensor arrangement; and changes a direction of propagation of the at least a portion of the at least part of the fourth amount of radiation such that the at least a portion of the at least part of the fourth amount of radiation is incident on the second sensor arrangement.

The radiation source may comprise a secondary radiation source, the secondary radiation source generating the first amount of radiation; and a timing controller connected to the secondary radiation source and configured to control the time at which the secondary radiation source generates the first amount of radiation.

The alignment detector may comprise an alignment radiation source configured to produce the third amount of radiation, wherein the alignment radiation source is mounted to the secondary radiation source such that a propagation direction of the third amount of radiation is substantially parallel to a propagation direction of the first amount of radiation; and wherein the radiation source is configured such that at least a part of the third amount of radiation is incident on the first sensor arrangement.

The alignment detector may comprise a beam splitter apparatus, and wherein the radiation source is configured such that at least part of the fourth amount of radiation is incident on at least part of the beam splitting apparatus; wherein the beam splitting apparatus is configured to direct at least a portion of said at least part of the fourth amount of radiation so that the at least a portion of said at least part of the fourth amount of radiation is incident on the second sensor arrangement.

The first sensor arrangement and/or second sensor arrangement may comprise a photoelectric sensor array.

The plasma formation location is located in a first chamber for containing a vacuum or a gas, and wherein the alignment detector is located outside of the first chamber.

The radiation source may further comprise a radiation directing device that is configured to direct the first amount of radiation and thereby determine the focus position of the first amount of radiation.

The radiation directing device may comprise a directing reflector, at least part of which, in use, is located in the path of the first amount of radiation, and at least one reflector actuator that is mechanically linked to the directing reflector, and whereby movement of the at least one reflector actuator changes the orientation and/or position of the directing reflector relative to the path of the first amount of radiation.

The beam splitting apparatus may be located downstream of the first directing reflector with respect to the direction of propagation of the fourth amount of radiation. The beam splitting apparatus may be located upstream of the first directing reflector with respect to the direction of propagation of the first amount of radiation.

The beam splitting apparatus may be located upstream of the first directing reflector with respect to the direction of propagation of the fourth amount of radiation. The beam splitting apparatus may be located downstream of the first directing reflector with respect to the direction of propagation of the first amount of radiation.

The radiation directing device may comprise a second directing reflector, at least part of which, in use, is located in the path of the first amount of radiation, and at least one second reflector actuator which is mechanically linked to the second directing reflector, and whereby movement of the at least one second reflector actuator changes the orientation and/or position of the second directing reflector relative to the path of the first amount of radiation.

The beam splitting apparatus may be located upstream of the second directing reflector with respect to the direction of propagation of the fourth amount of radiation. The beam splitting apparatus may be located downstream of the second directing reflector with respect to the direction of propagation of the first amount of radiation.

Both the first and second directing reflectors may be controlled by a controller to direct the first amount of radiation and thereby determine the focus position of the first amount of radiation.

The nozzle may be mechanically linked to at least one nozzle actuator, whereby movement of the at least one nozzle actuator changes the position and/or orientation of the nozzle relative to the remainder of the radiation source, and hence the trajectory of the stream of fuel droplets.

The radiation source may further comprise a controller, and wherein the first sensor arrangement provides a first sensor signal to the controller, the second sensor arrangement provides a second sensor signal to the controller; and wherein the controller is configured to control the relative alignment between the fuel droplet and the focus position of the first amount of radiation based on the first and second sensor signals.

The controller may be configured to control the relative alignment between the fuel droplet and the focus position of the first amount of radiation by controlling at least one of the following based on the first and second sensor signals: the position of the nozzle relative to the remainder of the radiation source, and hence the trajectory of the stream of fuel droplets; a propagation direction of the first amount of radiation, and hence the focus position of the first amount of radiation; and the time at which the first amount of radiation is incident on the fuel droplet.

According to a second aspect of the present invention there is provided a lithographic apparatus arranged to project a pattern from a patterning device onto a substrate, wherein the lithographic apparatus comprises a radiation source configured to provide a beam of radiation to the patterning device, the radiation source comprising a nozzle configured to direct a stream of fuel droplets along a trajectory towards a plasma formation location; and the radiation source being configured to receive a first amount of radiation such that, in use, the first amount of radiation is incident on a fuel droplet at the plasma formation location, and the first amount of radiation transfers energy to the fuel droplet to generate a radiation generating plasma that emits a second amount of radiation; the radiation source further comprising an alignment detector having a first sensor arrangement and a second sensor arrangement; the first sensor arrangement being configured to measure a property of a third amount of radiation that is indicative of a focus position of the first amount of radiation; and the second sensor arrangement being configured to measure a property of a fourth amount of radiation, the fourth amount of radiation being a portion of the first amount of radiation that is reflected by the fuel droplet upon which the first amount of radiation is incident.

According to a third aspect of the invention there is provided a method of operating a radiation source suitable for providing a beam of radiation to an illuminator of a lithographic apparatus, the radiation source comprising: a nozzle, a controller and an alignment detector having a first sensor arrangement and a second sensor arrangement, the method comprising: directing a stream of fuel droplets from the nozzle along a trajectory towards a plasma formation location; directing a first amount of radiation at the fuel droplet such that the first amount of radiation is incident on the fuel droplet at the plasma formation location, and such that the first amount of radiation transfers energy to the fuel droplet to generate a radiation generating plasma that emits a second amount of radiation; the first sensor arrangement measuring a property of a third amount of radiation that is indicative of a focus position of the first amount of radiation; the second sensor arrangement measuring a property of a fourth amount of radiation, the fourth amount of radiation being a portion of the first amount of radiation that is reflected by the fuel droplet upon which the first amount of radiation is incident; the first sensor arrangement providing a first sensor signal to the controller that is indicative of the focus position of the first amount of radiation; the second sensor arrangement providing a second sensor signal to the controller; and the controller determining the relative alignment between the fuel droplet and focus position of the first amount of radiation based on the first and second sensor signals.

The radiation source may further comprise a radiation directing device, a secondary radiation source and a timing controller connected to the secondary radiation source, the method comprising the secondary radiation source generating the first amount of radiation, the timing controller controlling the time at which the secondary radiation source generates the first amount of radiation, the radiation directing device directing the first amount of radiation and thereby determining the focus position of the first amount of radiation, and the controller, based on the first and second sensor signals, controlling the relative alignment between the fuel droplet and the focus position of the first amount of radiation by controlling at least one of the position of the nozzle relative to the remainder of the radiation source, and hence the trajectory of the stream of fuel droplets; controlling the radiation directing device and thereby controlling a propagation direction of the first amount of radiation, and hence the focus position of the first amount of radiation; and controlling the timing controller so as to control the time at which the first amount of radiation is incident on the fuel droplet.

According to a fourth aspect of the present invention there is provided a method of operating a radiation source suitable for providing a beam of radiation to an illuminator of a lithographic apparatus, the radiation source comprising: a nozzle, a controller and an alignment detector having a first sensor arrangement, a second sensor arrangement, a third sensor arrangement and a fourth sensor arrangement, the method comprising: directing a stream of fuel droplets from the nozzle along a trajectory towards a plasma formation location; directing a first amount of radiation at the fuel droplet such that the first amount of radiation is incident on the fuel droplet at the plasma formation location, and such that the first amount of radiation transfers energy to the fuel droplet to generate a modified fuel distribution; the first sensor arrangement measuring a property of a third amount of radiation that is indicative of a focus position of the first amount of radiation; the second sensor arrangement measuring a property of a fourth amount of radiation, the fourth amount of radiation being a portion of the first amount of radiation that is reflected by the fuel droplet upon which the first amount of radiation is incident; the first sensor arrangement providing a first sensor signal to the controller that is indicative of the focus position of the first amount of radiation; the second sensor arrangement providing a second sensor signal to the controller; the controller determining the relative alignment between the fuel droplet and focus position of the first amount of radiation based on the first and second sensor signals; directing a fifth amount of radiation at the modified fuel distribution such that the fifth amount of radiation is incident on the modified fuel distribution, and such that the fifth amount of radiation transfers energy to the modified fuel distribution to generate a radiation generating plasma that emits a second amount of radiation; the third sensor arrangement measuring a property of a sixth amount of radiation that is indicative of a focus position of the fifth amount of radiation; the fourth sensor arrangement measuring a property of a seventh amount of radiation, the seventh amount of radiation being a portion of the fifth amount of radiation that is reflected by the modified fuel distribution upon which the fifth amount of radiation is incident; the third sensor arrangement providing a third sensor signal to the controller that is indicative of the focus position of the fifth amount of radiation; the fourth sensor arrangement providing a fourth sensor signal to the controller; and the controller determining the relative alignment between the modified fuel distribution and focus position of the fifth amount of radiation based on the third and fourth sensor signals.

The first and third sensor arrangements may be one and the same; and the second and fourth sensor arrangements may be one and the same.

The radiation source may further comprise a first radiation directing device, a secondary radiation source and a timing controller connected to the secondary radiation source. The method may further comprise generating, with the secondary radiation source, the first amount of radiation; controlling, with the timing controller, the time at which the secondary radiation source generates the first amount of radiation; directing, with the first radiation directing device, the first amount of radiation and thereby determining the focus position of the first amount of radiation; and controlling, with the controller and based on at least one of the first and second sensor signals, the relative alignment between the fuel droplet and the focus position of the first amount of radiation by controlling the radiation directing device and thereby controlling a propagation direction of the first amount of radiation, and hence the focus position of the first amount of radiation.

The radiation source may further comprise a second radiation directing device, a secondary radiation source and a timing controller connected to the secondary radiation source. The method may further comprise generating, with the secondary radiation source, the fifth amount of radiation; controlling, with the timing controller, the time at which the secondary radiation source generates the fifth amount of radiation; directing, with the second radiation directing device, the fifth amount of radiation and thereby determining the focus position of the fifth amount of radiation; and controlling, with the controller and based on at least one of the first and second sensor signals, the relative alignment between the modified fuel distribution and the focus position of the fifth amount of radiation by controlling the radiation directing device and thereby controlling a propagation direction of the fifth amount of radiation, and hence the focus position of the fifth amount of radiation.

The first and second radiation directing devices may not be the same radiation directing device.

The first amount of radiation may not be incident on the second radiation directing device.

The radiation source may further comprise a third radiation directing device, the method further comprising directing, with the third radiation directing device, the fifth amount of radiation onto the second radiation directing device; wherein the first amount of radiation does not interact with said third radiation directing device.

According to a fifth embodiment of the present invention there is provided a radiation source suitable for providing a beam of radiation to an illuminator of a lithographic apparatus, the radiation source being configured to receive a first amount of radiation such that, in use, the first amount of radiation is incident on at least one radiation directing element and is then incident on a fuel droplet at a plasma formation location, and such that the first amount of radiation transfers energy to the fuel droplet to generate a radiation generating plasma that emits a second amount of radiation; the radiation source further comprising a first sensor arrangement configured to measure a property of a third amount of radiation that is indicative of a focus position of the first amount of radiation; and wherein, in use, the third amount of radiation is incident on the at least one radiation directing element such that at least a portion of the third amount of radiation which is incident on the at least one radiation directing element overlaps with at least a portion of the first amount of radiation which is incident on the at least one radiation directing element.

According to a sixth embodiment there is provided a radiation source suitable for providing a beam of radiation to an illuminator of a lithographic apparatus, the radiation source being configured to receive a first amount of radiation such that, in use, the first amount of radiation is incident on at least one radiation directing element and is then incident on a fuel droplet at a plasma formation location, and such that the first amount of radiation transfers energy to the fuel droplet to generate a radiation generating plasma that emits a second amount of radiation; the radiation source further comprising a first sensor arrangement configured to measure a property of a third amount of radiation and a further amount of radiation, the third and further amounts of radiation being collectively indicative of a focus position of the first amount of radiation; and wherein, in use, both the third amount of radiation and further amount of radiation are incident on the at least one radiation directing element.

The first sensor arrangement may comprise a first sensor configured to measure the property of the third amount of radiation, and a second sensor configured to measure the property of the further amount of radiation; and wherein the first amount of radiation propagates along an optical axis; and wherein the first sensor and second sensor are angularly spaced from one another about the optical axis by approximately 180 degrees.

In use, the third amount of radiation and/or further amount of radiation may be incident on the at least one radiation directing element such that at least a portion of the third amount of radiation and/or further amount of radiation which is incident on the at least one radiation directing element overlaps with at least a portion of the first amount of radiation which is incident on the at least one radiation directing element.

According to a seventh embodiment of the invention there is provided a radiation source suitable for providing a beam of radiation to an illuminator of a lithographic apparatus, the radiation source being configured to receive a first amount of radiation from a laser such that, in use, the first amount of radiation is incident on a fuel droplet at a plasma formation location, and such that the first amount of radiation transfers energy to the fuel droplet to generate a radiation generating plasma that emits a second amount of radiation; the radiation source further comprising a first sensor arrangement configured to measure a property of a third amount of radiation that is indicative of a focus position of the first amount of radiation; and wherein the laser comprises a lasing medium and wherein, in use, the third amount of radiation passes through the lasing medium.

The lasing medium may be contained in a amplification tube and the third amount of radiation may pass through the amplification tube.

The radiation source may be configured such that, in use, the first amount of radiation is incident on at least one radiation directing element and is then incident on the fuel droplet at a plasma formation location; and wherein, in use, the third amount of radiation is incident on the at least one radiation directing element.

The radiation source may be configured such that at least a portion of the third amount of radiation which is incident on the at least one radiation directing element overlaps with at least a portion of the first amount of radiation which is incident on the at least one radiation directing element.

According to an eighth embodiment of the invention there is provided a method of operating a radiation source suitable for providing a beam of radiation to an illuminator of a lithographic apparatus, the radiation source comprising: a controller, at least one radiation directing element and a first sensor arrangement, the method comprising: directing a first amount of radiation at a fuel droplet such that the first amount of radiation is incident on the at least one radiation directing element and then on the fuel droplet at a plasma formation location, and such that the first amount of radiation transfers energy to the fuel droplet to generate a radiation generating plasma that emits a second amount of radiation; measuring, with the first sensor arrangement, a property of a third amount of radiation that is indicative of a focus position of the first amount of radiation; providing, by the first sensor arrangement, a first sensor signal to the controller that is indicative of the focus position of the first amount of radiation; providing, by the controller, of a control signal to the at least one radiation directing element to control the focus position of the first amount of radiation based on the first sensor signal; wherein the third amount of radiation is incident on the at least one radiation directing element such that at least a portion of the third amount of radiation which is incident on the at least one radiation directing element overlaps with at least a portion of the first amount of radiation which is incident on the at least one radiation directing element.

According to a ninth aspect of the invention there is provided a method of operating a radiation source suitable for providing a beam of radiation to an illuminator of a lithographic apparatus, the radiation source comprising: a controller, at least one radiation directing element and a first sensor arrangement, the method comprising: directing a first amount of radiation at a fuel droplet such that the first amount of radiation is incident on the at least one radiation directing element and then on the fuel droplet at a plasma formation location, and such that the first amount of radiation transfers energy to the fuel droplet to generate a radiation generating plasma that emits a second amount of radiation; providing third and further amounts of radiation such that the third and further amounts of radiation are incident on the at least one radiation directing element; measuring, with the first sensor arrangement, a property of a third amount of radiation and a property of the further amount of radiation which are collectively indicative of a focus position of the first amount of radiation; providing, by the first sensor arrangement, a first sensor signal to the controller that is indicative of the focus position of the first amount of radiation; providing, by the controller, of a control signal to the at least one radiation directing element to control the focus position of the first amount of radiation based on the first sensor signal.

The first sensor arrangement may comprise a first sensor configured to measure the property of the third amount of radiation, and a second sensor configured to measure the property of the further amount of radiation; and wherein the first amount of radiation is directed such that it propagates along an optical axis; and wherein the first sensor and second sensor are angularly spaced from one another about the optical axis by approximately 180 degrees.

The third amount of radiation and/or further amount of radiation may be provided such that they/it are/is incident on the at least one radiation directing element such that at least a portion of the third amount of radiation and/or further amount of radiation incident on the at least one radiation directing element overlaps with at least a portion of the first amount of radiation which is incident on the at least one radiation directing element.

According to a tenth aspect of the invention there is provided a method of operating a radiation source suitable for providing a beam of radiation to an illuminator of a lithographic apparatus, the radiation source comprising: a controller, at least one radiation directing element, a first sensor arrangement and a laser comprising a lasing medium, the method comprising: providing, by the laser, a first amount or radiation; directing a first amount of radiation at a fuel droplet such that the first amount of radiation is incident on at least one radiation directing element and then on the fuel droplet at a plasma formation location, and such that the first amount of radiation transfers energy to the fuel droplet to generate a radiation generating plasma that emits a second amount of radiation; directing a third amount of radiation such that it passes through the lasing medium; measuring, with the first sensor arrangement, a property of the third amount of radiation that is indicative of a focus position of the first amount of radiation; providing, by the first sensor arrangement, a first sensor signal to the controller that is indicative of the focus position of the first amount of radiation; providing, by the controller, of a control signal to the at least one radiation directing element to control the focus position of the first amount of radiation based on the first sensor signal.

The lasing medium may be contained in a amplification tube and the third amount of radiation may pass through the amplification tube.

The third amount of radiation may be directed such that the third amount of radiation is incident on the at least one radiation directing element.

The third amount of radiation may be directed such that at least a portion of the third amount of radiation which is incident on the at least one radiation directing element overlaps with at least a portion of the first amount of radiation which is incident on the at least one radiation directing element.

According to an eleventh aspect of the invention, there is provided a radiation source suitable for providing a beam of radiation to an illuminator of a lithographic apparatus, the radiation source being configured to receive a first amount of radiation such that, in use, the first amount of radiation propagates along an optical axis, is incident on at least one radiation directing element and is then incident on a fuel droplet at a plasma formation location, and such that the first amount of radiation transfers energy to the fuel droplet to generate a radiation generating plasma that emits a second amount of radiation; the radiation source further comprising a first sensor arrangement comprising a first sensor configured to measure a property of a third amount of radiation, and a second sensor configured to measure a property of a further amount of radiation, wherein the first sensor and second sensor are angularly spaced from one another about the optical axis; and wherein the third and further amounts of radiation are collectively indicative of a divergence of the first amount of radiation; and wherein, in use, both the third amount of radiation and further amount of radiation are incident on the at least one radiation directing element.

The first sensor and second sensor may be angularly spaced from one another about the optical axis by approximately 180 degrees.

According to a twelfth aspect of the invention there is provided a method of operating a radiation source suitable for providing a beam of radiation to an illuminator of a lithographic apparatus, the radiation source comprising: a controller, at least one radiation directing element and a first sensor arrangement comprising first and second sensors, the method comprising: directing a first amount of radiation at a fuel droplet along an optical axis such that the first amount of radiation is incident on the at least one radiation directing element and then on the fuel droplet at a plasma formation location, and such that the first amount of radiation transfers energy to the fuel droplet to generate a radiation generating plasma that emits a second amount of radiation; providing the first and second sensors such they are angularly spaced form one another about the optical axis; providing third and further amounts of radiation such that the third and further amounts of radiation are incident on the at least one radiation directing element; measuring, with the first sensor, a property of a third amount of radiation; measuring, with the second sensor, a property of the further amount of radiation, such that the measured property of the third amount of radiation and the measured property of the further amount of radiation are collectively indicative of a divergence of the first amount of radiation; and providing, by the first sensor arrangement, a first sensor signal to the controller that is indicative of the divergence of the first amount of radiation.

The first sensor and second sensor may be angularly spaced from one another about the optical axis by approximately 180 degrees.

According to a thirteenth aspect of the invention, there is provided a radiation source suitable for providing a beam of radiation to an illuminator of a lithographic apparatus, the radiation source comprising at least one optical element adapted to interact with a first amount of radiation; and at least one actuable element; wherein the at least one actuable element is vibrationally isolated from the at least one optical element.

By vibrationally isolating it is meant that transfer to the at least one optical element of vibrations/oscillations caused by movement of the actuable element is eliminated or reduced. In this way, actuation of the at least one actuable element results in less vibration, and therefore less undesirable movement, of the at least one optical element.

The at least one actuable element may be vibrationally isolated at a frequency below a maximum frequency at which the actuable element is adapted to be actuated.

The at least one actuable element may be vibrationally isolated from the at least one optical element by isolation means attached to said at least one optical element and/or the at least one actuable element may be vibrationally isolated from the at least one optical element by isolation means attached to the at least one actuable element.

The isolations means attached to the at least one actuable element may comprise a body having a mass greater than the at least on actuable element.

The at least one actuable element may be vibrationally isolated from the at least one optical element by the at least one actuable element being mounted to a first platform, and the at least one optical element being mounted to a second platform.

The at least one actuable element may comprises a first directing reflector and at least one first reflector actuator which is mechanically linked to the first directing reflector. Movement of the at least one first reflector actuator may change the orientation and/or position of the first directing reflector relative to the path of the first amount of radiation.

The at least one actuable element and the at least one optical element may be coupled oscillators and, in use, the vibrational isolation may reduce the effect of oscillation of the at least one actuable element on the at least one optical element.

According to a fourteenth aspect of the invention, there is provided a lithographic apparatus arranged to project a pattern from a patterning device onto a substrate, wherein the lithographic apparatus comprises a radiation source according to any one of claims 63 to 70 configured to provide a beam of radiation to the patterning device.

According to an fifteenth aspect of the present invention, there is provided a radiation source suitable for providing a beam of radiation to an illuminator of a lithographic apparatus, the radiation source comprising a plurality of optical elements adapted to interact with a first amount of radiation and at least one actuable element, wherein a first one of said plurality of optical elements is mechanically coupled to a second one of said optical elements such that.

In any of the above aspects, the first amount of radiation may not transfer energy to the fuel droplet to generate a radiation generating plasma that emits a second amount of radiation. For example, the first amount of radiation may be a pre-pulse which is incident on the fuel to create a modified fuel distribution instead of generating a radiation generating plasma that emits a second amount of radiation.

Features of any of the above aspects of the invention may be combined to arrive at other embodiments of the invention.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 1:
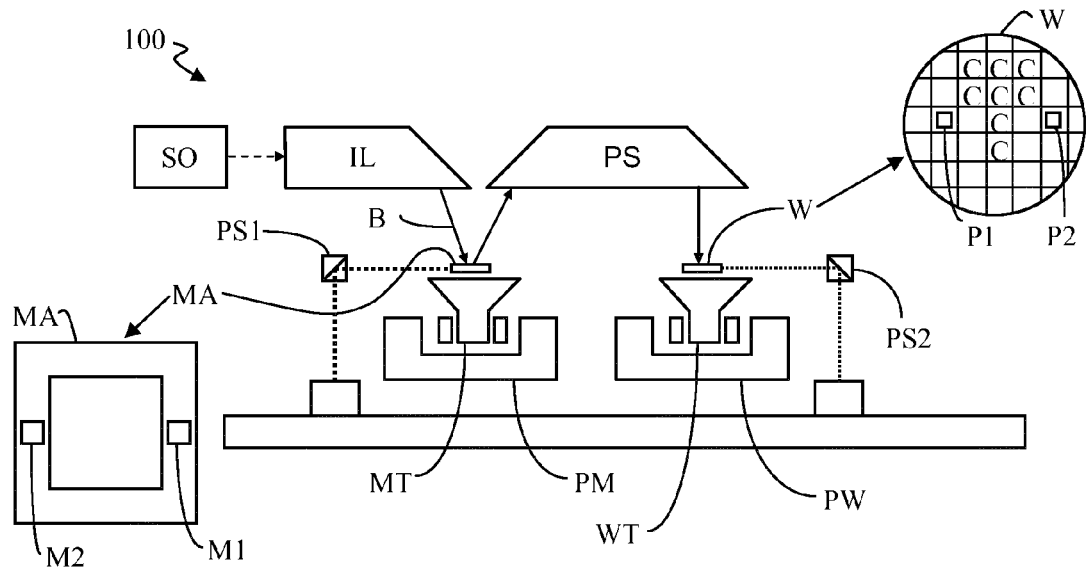
FIG. 1 depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

FIG. 1 schematically depicts a lithographic apparatus 100 including a source collector module SO according to one embodiment of the invention. The apparatus comprises:

- an illumination system (illuminator) IL configured to condition a radiation beam B (e.g., EUV radiation).
- a support structure (e.g., a mask table) MT constructed to support a patterning device (e.g., a mask or a reticle) MA and connected to a first positioner PM configured to accurately position the patterning device;
- a substrate table (e.g., a wafer table) WT constructed to hold a substrate (e.g., a resist-coated wafer) W and connected to a second positioner PW configured to accurately position the substrate; and
- a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultraviolet (EUV) radiation beam from the source collector module SO. The source collector module SO may also be referred to as a radiation source. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel with a laser beam. Fuel may for example be a droplet, stream or cluster of material having the required line-emitting element. The source collector module SO may be part of an EUV radiation system including a laser, not shown in FIG. 1, for providing the laser beam that excites the fuel. The resulting plasma emits output radiation, e.g., EUV radiation, which is collected using a radiation collector located in the source collector module. The laser and the source collector module may be separate entities, for example when a CO2 laser is used to provide the laser beam for fuel excitation. In such cases, the laser is not considered to form part of the lithographic apparatus, and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
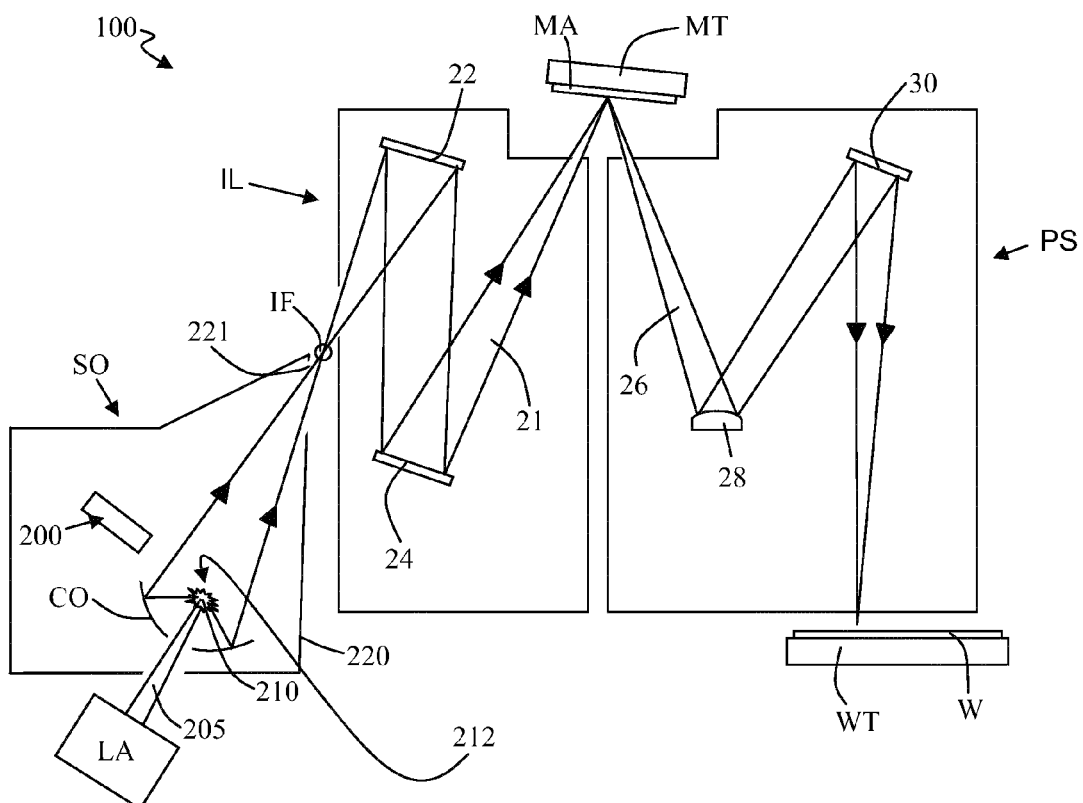
FIG. 2 depicts the lithographic apparatus of FIG. 1 in more detail.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. The source collector module may also be referred as a radiation source.

A secondary radiation source, in this case a laser LA, is arranged to deposit energy via a first amount of radiation (in this case laser beam 205) into a fuel, such as xenon (Xe), tin (Sn) or lithium (Li) which is provided from a fuel supply 200, thereby creating a highly ionized plasma 210 at a plasma formation location with electron temperatures of several 10's of eV. The laser LA may emit infra red (IR) radiation. The energetic radiation generated during de-excitation and recombination of these ions is emitted from the plasma, collected and focussed by a near normal incidence collector optic CO. The laser may operate in a pulsed manner.

Radiation that is reflected by the collector optic CO is focused in a virtual source point IF. The virtual source point IF is commonly referred to as the intermediate focus, and the source collector module SO is arranged such that the intermediate focus IF is located at or near an opening 221 in the enclosing structure 220. The virtual source point IF is an image of the radiation emitting plasma 210.

Subsequently the radiation traverses the illumination system IL. The illumination system IL may include a facetted field mirror device 22 and a facetted pupil mirror device 24 arranged to provide a desired angular distribution of the radiation beam 21 at the patterning device MA, as well as a desired uniformity of radiation intensity at the patterning device MA. Upon reflection of the beam of radiation 21 at the patterning device MA, a patterned beam 26 is formed and the patterned beam 26 is imaged by the projection system PS via reflective elements 28, onto a substrate W held by the substrate table WT.

More elements than shown may generally be present in the illumination system IL and projection system PS. Further, there may be more mirrors present than those shown in the Figures, for example there may be 1-6 additional reflective elements present in the projection system PS than shown in FIG. 2.

Figure 3:
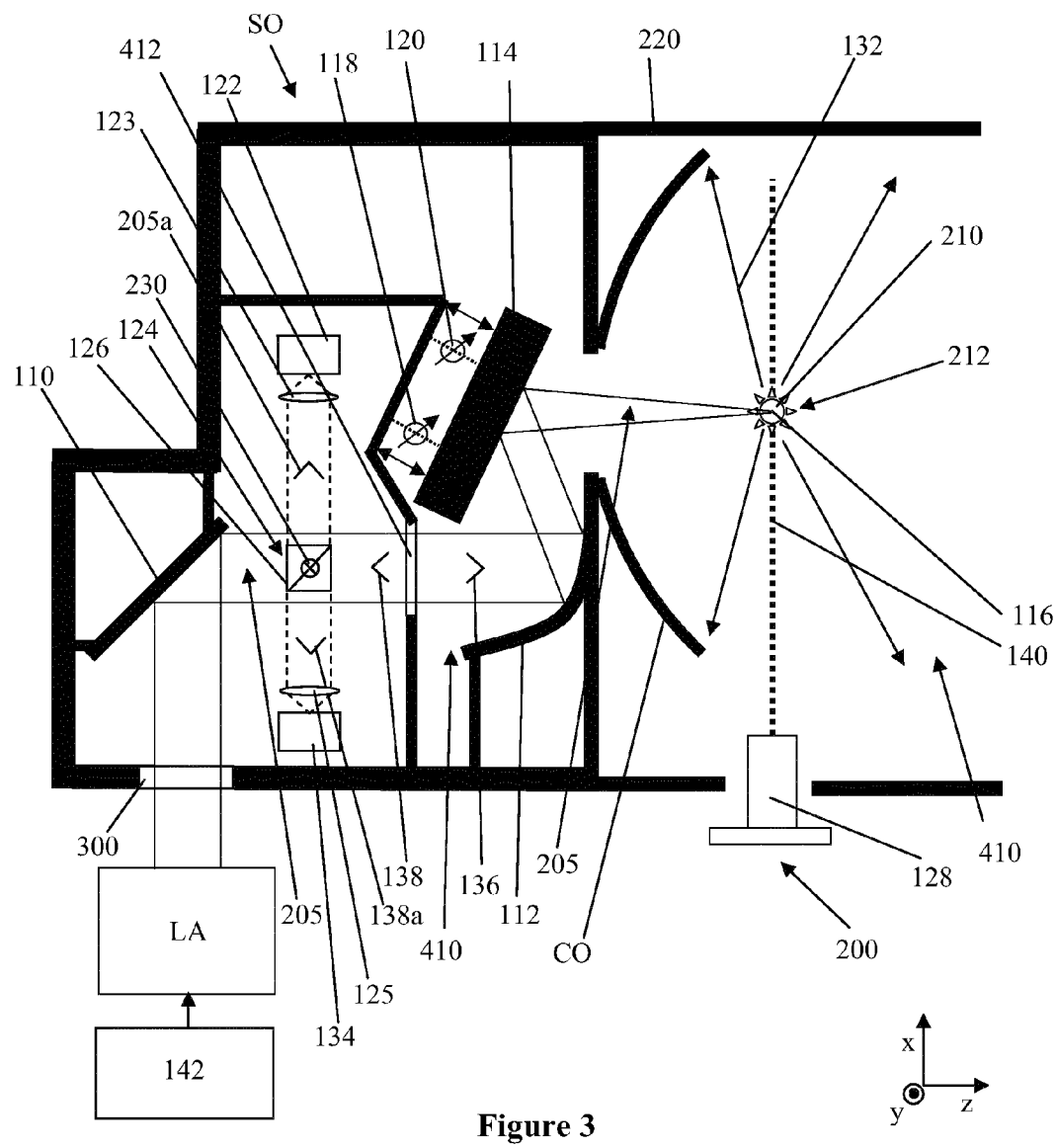
FIG. 3 is a schematic plan view of a radiation source according to an embodiment of the invention that forms part of the lithographic apparatus shown in FIGS. 1 and 2.

FIG. 3 shows the radiation source SO in more detail. The radiation source SO comprises two fixed reflective elements 110, 112 and a moveable reflective element 114 that collectively direct and focus the first amount of radiation (also referred to as a beam of radiation 205) towards a focus position 116 of the radiation beam 205. The focus position 116 of the radiation beam 205 may also be referred to as the position of the beam waist of the first amount of radiation. It will be appreciated that in other embodiments of the invention, any appropriate number fixed reflector elements and/or movable reflector elements may be used to direct and focus the first amount of radiation towards the focus position of the radiation beam. Furthermore, in other embodiments of the invention, any appropriate focussing element(s) (i.e., other than reflector elements) may be used to focus the first amount of radiation towards a focus position.

The moveable reflector element 114 forms part of a radiation directing device. The reflector element 114 (or reflector) of the radiation directing device is located in the path of the radiation beam 205 (also referred to as a first amount of radiation). The radiation directing device also comprises at least one reflector actuator that is mechanically linked to the reflector 114. In this case, the radiation directing device comprises two reflector actuators 118, 120 which are mechanically linked to the reflector 114. Movement of at least one of the reflector actuators 118, 120 changes the orientation and/or position of the reflector 114 relative to the path of the beam of radiation 205. In this way, the reflector actuator can be actuated in order to adjust the orientation and/or position of the reflector 114 relative to the radiation beam 205 so as to alter the focus position 116 of the beam of radiation 205.

It will be appreciated that although two reflector actuators 118, 120 have been shown in the present embodiment, in other embodiments there may be any appropriate number of reflector actuators provided there is at least one reflector actuator. Furthermore, it will be appreciated that in the present embodiment the reflector actuators 118, 120 change the orientation and/or position of the reflector 114 relative to the radiation beam 205. However, in other embodiments, the actuator(s) may alter any appropriate property of the reflector that will alter the focus position of the radiation beam. For example, the actuator(s) may change the shape of the reflector. Although the radiation directing device of the present embodiment comprises a reflector 114, in other embodiments the radiation directing device may comprise any appropriate directing element that is capable of altering the focus position of the radiation beam. For example, the radiation directing device may comprise a plurality of lens elements, the properties of each lens element being adjustable.

As previously discussed, the radiation source SO comprises a fuel supply 200. The fuel supply 200 has a nozzle 128 that is configured to direct a stream of fuel droplets along a trajectory 140 towards a plasma formation location 212.

The fuel supply 200 and hence the nozzle 128 are moveable relative to the rest of (or the remainder of) the radiation source SO (and in particular relative to the radiation collector CO) by at least one actuator (not shown). The at least one actuator is mechanically linked to the fuel supply 200 and nozzle 128. The trajectory 140 of the fuel droplet is parallel to an x-axis. The x-axis is marked on FIG. 3 for ease of reference. The x-axis extends in a direction that is generally from the bottom of the Figure to the top of the Figure. A z-axis, which is perpendicular to the x-axis, extends in a direction that is generally from the left of the page to the right of the page. A y-axis that is perpendicular to both the x-axis and the z-axis extends generally out of the plane of the page.

The fuel supply 200 and hence nozzle 128 of the present embodiment are moveable by the actuators (not shown) within the y-z plane. That is to say, the fuel supply 200 and nozzle 128 are not moveable in the direction parallel to the x-axis. However, it will be appreciated that in other embodiments of the invention, the fuel supply and nozzle may be moveable in a direction parallel to the x-axis. Furthermore, in other embodiments of the invention, the fuel supply 200 and nozzle 128 may be tilted relative to the x-axis.

In use, the radiation source SO receives a first amount of radiation (in this case the radiation beam 205 from the laser LA via a window 300) such that the first amount of radiation is incident on a fuel droplet (not shown) which has been dispensed from the nozzle 128 and which is located at the plasma formation location 212. At the plasma formation location 212, the first amount of radiation is incident on the fuel droplet (not shown) so that the first amount of radiation transfers energy to the fuel droplet so as to generate a radiation generating plasma 210 that emits a second amount of radiation 132.

In this case the second amount of radiation 132 is EUV radiation, but it will be appreciated that in other embodiments the second amount of radiation may be any appropriate type of radiation. The second amount of radiation is focused and directed out of the radiation source SO towards the illuminator of the lithographic apparatus by the source collector CO. The source collector CO may also be referred to as a radiation collector.

It will be appreciated that the fuel droplet that has become the radiation producing plasma 210 is not shown within FIG. 3. This is because FIG. 3 shows the radiation source SO at a time after the first amount of radiation has transferred energy into the fuel droplet such that the fuel droplet has become the radiation producing plasma 210. It will also be appreciated that before the fuel droplet became the radiation producing plasma, the fuel droplet was located substantially at the plasma formation location 212. That is to say, when the first amount of radiation is incident on the fuel droplet such that the first amount of radiation transfers energy to the fuel droplet, the fuel droplet is located substantially at the plasma formation location 212.

It will be appreciated that although the secondary radiation source (in this case the laser LA) is part of the radiation source SO in this embodiment of the invention, in other embodiments of the invention this need not be the case. For example, the secondary radiation source may be separate to the radiation source.

The radiation source SO may also have a timing controller 142 that is connected to the secondary radiation source (in this case the laser LA). The timing controller 142 is configured so as to control the time at which the secondary radiation source generates the first amount of radiation (in this case radiation beam 205).

The timing controller 142 controls the secondary radiation source such that the secondary radiation source generates the first amount of radiation at a time such that the first amount of radiation reaches the focus position 116 at substantially the same time that the fuel droplet is located at the focus position 116. Consequently, the first amount of radiation is incident on the fuel droplet and energy is transferred from the first amount of radiation to the fuel droplet such that the fuel droplet becomes the radiation generating plasma 210. Consequently, the position at which the fuel droplet becomes the radiation generating plasma 210 is the plasma formation location.

The radiation source SO has an alignment detector that comprises a first sensor arrangement 122, a second sensor arrangement 134 and a beam splitting apparatus 124.

The first sensor arrangement 122 is configured to measure a property of a third amount of radiation that is indicative of the focus position of the first amount of radiation 205. The second sensor arrangement 134 is configured to measure a property of a fourth amount of radiation. The property of the fourth amount of radiation measured by the second sensor arrangement may be indicative of the position of the fuel droplet. For example, the property of the fourth amount of radiation measured by the second sensor arrangement may be indicative of the position of the fuel droplet relative to at least part of the alignment detector, for example, relative to the beam splitter and/or relative to the second sensor arrangement. The position of the fuel droplet relative to (at least part of) the alignment detector may provide an indication of the position of the fuel droplet relative to other features of the radiation source, such as an optical axis of the beam of the first amount of radiation or the radiation collector CO. The nature of the third amount of radiation and the fourth amount of radiation are discussed in more detail below.

The beam splitting apparatus 124 of the alignment detector is located such that at least part of the first amount of radiation 205 is incident on at least part of the beam splitting apparatus 124. The beam splitting apparatus 124 is located such that the at least part of the first amount of radiation 205 that is incident on the beam splitting apparatus is substantially collimated. The beam splitting apparatus 124 is configured to direct at least a portion of the at least part of the first amount of radiation (which is incident on the beam splitting apparatus 124) so that the at least a portion of the first amount of radiation that is directed by the beam splitting apparatus 124 is incident on the first sensor arrangement 122. In this case, the portion of the at least part of the first amount of radiation (which is incident on the beam splitter apparatus 124) that is directed by the beam splitter apparatus 124 so that it is incident on the first sensor arrangement is the third amount of radiation referred to above.

In the case shown in FIG. 3, the beam splitting apparatus 124 is a beam splitter 126, such as a diamond window. Part of the first amount of radiation 205 is reflected by the beam splitter 126 towards the first sensor arrangement 122. The part of the first amount of radiation 205 that is reflected by the beam splitter 126 so that it is incident on the first sensor arrangement 122 is indicated by 205a. As previously discussed, in this case, the portion 205a of the first amount of radiation 205 that is directed (in this case reflected) by the beam splitter 126 so that it is incident on the first sensor arrangement 122 is also referred to as the third amount of radiation 205a.

Due to the fact that the part of the first amount of radiation 205 that is reflected by the beam splitter 126 towards the first sensor arrangement 122 is substantially collimated, the third amount of radiation 205a is also substantially collimated. The third amount of radiation 205a passes through a first conversion optical element 123 (in this case a converging lens) before it is incident on the first sensor arrangement 122. The first conversion optical element 123 converges the collimated third amount of radiation 205a such that it is focused to a beam spot that is incident on the first sensor arrangement 122. The first conversion optical element 123 converts a spatial frequency distribution (e.g., the direction in which the beam is propagating) within the collimated beam of the third amount of radiation 123 into an intensity distribution (e.g., the position at which the focused beam spot is incident on the first sensor arrangement 122).

A portion of the first amount of radiation 205 that is incident on the beam splitter 126 passes through the beam splitter 126 and then passes to the focus position 116 of the first amount of radiation 205 so that it is incident on the fuel droplet at the plasma formation location 212. The portion of the first amount of radiation 205 that passes through the beam splitter 126 towards the focus position 116 of the first amount of radiation 205 may be referred to as the forward beam and is indicated by the arrow 136.

The radiation source SO is configured such that at least part of a fourth amount of radiation is incident on at least part of the beam splitting apparatus 124. For example, the beam splitting apparatus 124 may be located such that at least part of the fourth amount of radiation is incident on at least part of the beam splitting apparatus 124. The beam splitting apparatus 124 is configured to direct at least a portion of the at least part of the fourth amount of radiation (which is incident on the beam splitting apparatus) so that the at least a portion of the fourth amount of radiation is directed by the beam splitting apparatus 124 so that it is incident on the second sensor arrangement 134.

As previously discussed, a portion of the first amount of radiation 205 passes through the beam splitting apparatus 124 so that the portion of the first amount of radiation that has passed through the beam splitting apparatus 124 (which may be referred to as the forward beam 136) is incident on the fuel droplet at the plasma formation location 212. Although a portion of the first amount of radiation incident on the fuel droplet at the plasma formation location 212 transfers energy (for example by absorption) to the fuel droplet so as to generate a radiation generating plasma 210 that emits a second amount of radiation, some of the first amount of radiation that is incident on the fuel droplet at the plasma formation location 212 will be reflected by the fuel droplet and/or the radiation generating plasma 210. The portion of the first amount of radiation that is reflected by the fuel droplet and/or radiation generating plasma is the fourth amount of radiation, which may also be referred to as the return beam. Within FIG. 3, the return beam is indicated by the arrow 138. In some embodiments the fuel droplet may be considered to act substantially like a point source such that the relative alignment between the focus position of the first amount of radiation and the fuel droplet does not substantially affect the direction in which the fourth amount of radiation propagates. Rather, it is the direction of propagation of the first amount of radiation incident on the fuel droplet that affects the direction in which the fourth amount of radiation propagates. In some embodiments the fuel droplet may not be considered to act substantially like a point source. In such embodiments the relative alignment between the focus position of the first amount of radiation and the fuel droplet may affect the direction in which the fourth amount of radiation propagates.

At least one property of the fourth amount of radiation (return beam 138) will be affected by the position of the fuel droplet relative to at least part of the alignment detector. Properties of the fourth amount of radiation that may be affected by the position of the fuel droplet relative to at least part of the alignment detector include: the direction of propagation of the fourth amount of radiation, the total intensity of the fourth amount of radiation and the intensity distribution of the fourth amount of radiation.

For the case shown in FIG. 3, the fourth amount of radiation (return beam 138) is incident on the beam splitter 126 such that the beam splitter 126 directs (in this case, by reflection) at least a portion of the fourth amount of radiation (return beam 138) so that the portion of the fourth amount of radiation (return beam 138) that is directed by the beam splitter 126 is incident on the second sensor arrangement 134. The portion of the fourth amount of radiation (return beam 138) that is reflected by the beam splitter 126 so that it is incident on the second sensor arrangement 134 is indicated by 138*a*.

The portion 138*a* of the fourth amount of radiation that is reflected by the beam splitter 126 towards the second sensor arrangement 134 is also substantially collimated. The portion 138*a* of the fourth amount of radiation passes through a second conversion optical element 125 (in this case a converging lens) before it is incident on the second sensor arrangement 134. The second conversion optical element 125 converges the collimated portion 138*a* of the fourth amount of radiation such that it is focused to a beam spot that is incident on the second sensor arrangement 134. The second conversion optical element 125 converts a spatial frequency distribution (e.g., the direction in which the beam is propagating) within the collimated beam of the portion 138*a* of the fourth amount of radiation into an intensity distribution (e.g., the position at which the focused beam spot is incident on the second sensor arrangement 134).

It will be appreciated that although the beam splitter apparatus 124 shown in FIG. 3 is a beam splitter 126, any suitable beam splitting apparatus may be used provided the beam splitting apparatus is capable of directing a portion of the first amount of radiation so that it is incident on the first sensor arrangement, and capable of directing a portion of the fourth amount of radiation so that it is incident on the second sensor arrangement 134.

In the embodiment of the present invention shown in FIG. 3 the radiation source SO is configured (and in particular the beam splitting apparatus 124 is located) such that at a beam splitting position 230 the beam splitting apparatus 124 (in this case the beam splitter 126) both: changes the direction of propagation of the portion 205*a* of the first amount of radiation such that the portion 205*a* of the first amount of radiation is incident on the first sensor arrangements 122; and changes the direction of propagation of the portion 138*a* of the fourth amount of radiation such that the portion 138*a* of the fourth amount of radiation is incident on the second sensor arrangement 134.

Arranging the beam splitting apparatus (in this case the beam splitter 126) so that a portion 205*a* of the first amount of radiation and a portion 138*a* of the fourth amount of radiation are directed towards the first sensor arrangement 122 and second sensor arrangement 134 respectively at a common beam splitting position may minimize or eliminate potential error in measuring certain properties of the third and fourth amounts of radiation. For example, using a common beam splitting position in this way may minimise or eliminate potential error in measuring a property of the third amount of radiation 205*a* (measured by the first sensor arrangement 122) relative to a property of the fourth amount of radiation 138*a* (measured by the second sensor arrangement 134). That is to say, by using a common beam splitting position in this way, an error in the measurement of a property of the third amount of radiation 205*a* (measured by the first sensor arrangement 122) may be substantially equal to an error in the measurement of a property of the fourth amount of radiation 138*a* (measured by the second sensor arrangement 134). In this way, when the measurement of a property of the third amount of radiation 205*a* is compared to a measurement of a property of the fourth amount of radiation 138*a*, the error in the measurement of the property of the third amount of radiation 205*a* is cancelled out by the error in the measurement of the property of the fourth amount of radiation 138*a*. Such potential errors in the property of the third amount of radiation measured by the first sensor arrangement 122 relative to the property of the fourth amount of radiation measured by the second sensor arrangement 134 may be due to misalignment of the beam splitting apparatus 124 relative to either the first amount of radiation or the fourth amount of radiation, and/or due to misalignment of the first sensor arrangement 122 and/or the second sensor arrangement 134 relative to the beam splitting apparatus 124. Other potential errors may be caused by relative movement between the alignment detector and the secondary radiation source, or by relative movement between the beam splitter apparatus and the first and/or second sensor arrangement.

The first sensor arrangement and the second sensor arrangement may comprise a photoelectric sensor array. A photoelectric sensor array has a plurality of photoelectric sensors, each of which produces a charge and/or undergoes a change in at least one of its electronic properties when radiation is incident upon it. Examples of photoelectric sensor arrays include a charge coupled device (CCD) or a position sensitive device (PSD). The first sensor arrangement and the second sensor arrangement are capable of outputting a first sensor signal and a second sensor signal, respectively, which are indicative of at least one property of the third amount of radiation incident on the first sensor arrangement and the fourth amount of radiation incident on the second sensor arrangement respectively. The at least one property of the third and fourth amounts of radiation that are measured by the first and second sensor arrangements respectively may include at least one of the following: the position of a part of the radiation incident on the respective sensor arrangement (for example, if the third or fourth amount of radiation is a beam of radiation, then the first or second sensor arrangement may output a signal indicative of the position of the centre of the respective beam of radiation), the total intensity of the third or fourth amount of radiation, and the intensity distribution of the third or fourth amount of radiation.

As previously discussed, the third and fourth amounts of radiation that are incident on either the first and second sensor arrangements respectively pass through the first conversion optical element (in this case a converging lens) or the second conversion optical element (also in this case a converging lens) respectively. The first and second sensor arrangements are located relative to the first and second conversion optical elements respectively such that the third and fourth amounts of radiation are respectively focused into a beam spot that is incident upon the first and second sensor arrangements. The conversion optical elements convert a spatial frequency distribution (e.g., the direction in which the beam is propagating) within the substantially collimated beam of the third and fourth amounts of radiation into an intensity distribution (e.g., the position at which the focused beam spot is incident on the relevant sensor arrangement). Consequently, the first and second sensor arrangements measure the position of the focussed beam spot of the third and fourth amounts of radiation respectively. By measuring the position of the focussed beam spot of the third and fourth amounts of radiation, the first and second sensor arrangements also measure the spatial frequency distribution (e.g., the direction in which the beam is propagating) of the third and fourth amounts of radiation.

The radiation source SO may also have a controller (not shown), which may be referred to as the radiation source controller. The first sensor signal outputted by the first sensor arrangement and the second sensor signal outputted by the second sensor arrangement may be fed to a controller. The controller may use the first sensor signal to determine the focus position of the first amount of radiation. The controller may also use the first and second sensor signals to compare at least one property of the third amount of radiation to the same at least one property of the fourth amount of radiation. By comparing the at least one property of the third amount of radiation with the same at least one property of the fourth amount of radiation it is possible to determine or infer the relative alignment between the fuel droplet and the first amount of radiation. In order to determine or infer the relative alignment between the fuel droplet and the first amount of radiation, it may be necessary to first calibrate the radiation source. Calibration of the radiation source is discussed in more detail below. In the case where the first sensor arrangement provides a first sensor signal to the controller and the second sensor arrangement provides a second sensor signal to the controller, the controller may be configured to control the relative alignment between the fuel droplet and the focus position of the first amount of radiation based on the first and second sensor signals.

The controller may be configured to control the relative alignment between the fuel droplet and the focus position of the first amount of radiation by controlling at least one of the following, based on the first and second sensor signals: the position of the nozzle relative to the remainder of the radiation source, and hence the trajectory of the stream of fuel droplets; the propagation direction of the first amount of radiation, and hence the focus position of the first amount of radiation; and the time at which the first amount of radiation is incident on the fuel droplet.

In order to control the propagation direction of the first amount of radiation, and hence the focus position of the first amount of radiation, the controller may provide a first control signal to the reflector actuators 118, 120 to thereby control the orientation and/position of the directing reflector 114 relative to the path of the first amount of radiation 205. In order to control the position of the nozzle relative to the remainder of the radiation source, and hence the trajectory 140 of the stream of fuel droplets, the controller may provide a second control signal to the actuator that is mechanically linked to the fuel supply 200 and nozzle 128. In order to control the time at which the first amount of radiation is incident on the fuel droplet, the controller may provide a control signal to the timing controller 142.

As previously discussed, the reflector element 110 shown in the embodiment of the invention FIG. 3 is fixed. In other embodiments of the present invention the reflector 110 may be moveable and may form part of the radiation directing device. In such an embodiment the reflector element 110 may be located upstream (with respect to the direction of propagation of the first amount of radiation 205 produced by the secondary radiation source LA) of the beam splitter apparatus 124 and the movable reflector element 114. Furthermore, the beam splitter apparatus 124 may be located in the path of the first amount of radiation 205 between the movable reflector element 114 and the reflector element 110.

The reflector element 110 may be mechanically linked to at least one reflector actuator (not shown). Movement of the at least one reflector actuator changes the orientation and/or position of the reflector element 110 relative to the path of the beam of radiation 205. In this way, the at least one reflector actuator can be actuated in order to adjust the orientation and/or position of the reflector element 110 relative to the radiation beam 205 so as to alter the focus position 116 of the beam of radiation 205. In other embodiments, the at least one reflector actuator may alter any appropriate property of the reflector element that will alter the focus position of the radiation beam. For example, the at least one reflector actuator may change the shape of the reflector element. Although the radiation directing device of the present embodiment comprises a reflector element 110, in other embodiments the radiation directing device may comprise any appropriate directing element that is capable of altering the focus position of the radiation beam. For example, the radiation directing device may comprise a plurality of lens elements, the properties of each lens element being adjustable.

As previously discussed, the radiation source SO may also have a radiation source controller (not shown). The controller may use the first sensor signal to determine the focus position of the first amount of radiation. The controller may also use the first and second sensor signals to compare at least one property of the third amount of radiation to the same at least one property of the fourth amount of radiation. By comparing the at least one property of the third amount of radiation with the same at least one property of the fourth amount of radiation it is possible to determine or infer the relative alignment between the fuel droplet and the first amount of radiation.

The radiation source controller may be configured to control the relative alignment between the fuel droplet and the focus position of the first amount of radiation by controlling at least one of the following, based on the first and second sensor signals: the position of the nozzle relative to the remainder of the radiation source, and hence the trajectory of the stream of fuel droplets; the propagation direction of the first amount of radiation, and hence the focus position of the first amount of radiation; and the time at which the first amount of radiation is incident on the fuel droplet.

In order to control the propagation direction of the first amount of radiation, and hence the focus position of the first amount of radiation, the controller may provide a first control signal to the reflector actuators 118, 120 and a second control signal to the at least one reflector element actuator (not shown) which is mechanically linked to the reflector element. The first control signal provided to the reflector actuators 118, 120 may control the orientation and/position of the directing reflector 114 relative to the path of the first amount of radiation 205. The second control signal provided to the at least one reflector element actuator (not shown) which is mechanically linked to the reflector element may control the orientation and/position of the reflector element 110 relative to the path of the first amount of radiation 205.

In some embodiments the controller, reflector actuators 118, 120 and at least one reflector element actuator may be configured such that the control bandwidth for controlling the orientation and/position of the reflector element 110 relative to the path of the first amount of radiation 205 is greater than the control bandwidth for controlling the orientation and/position of the directing reflector 114 relative to the path of the first amount of radiation 205. That is to say that in some embodiments the rate at which the reflector actuators can be controlled so as to control the orientation and/position of the directing reflector 114 relative to the path of the first amount of radiation 205 may be less than the rate at which the at least on reflector element actuator can be controlled so as to control the orientation and/position of the reflector element 110 relative to the path of the first amount of radiation 205.

Figure 4:
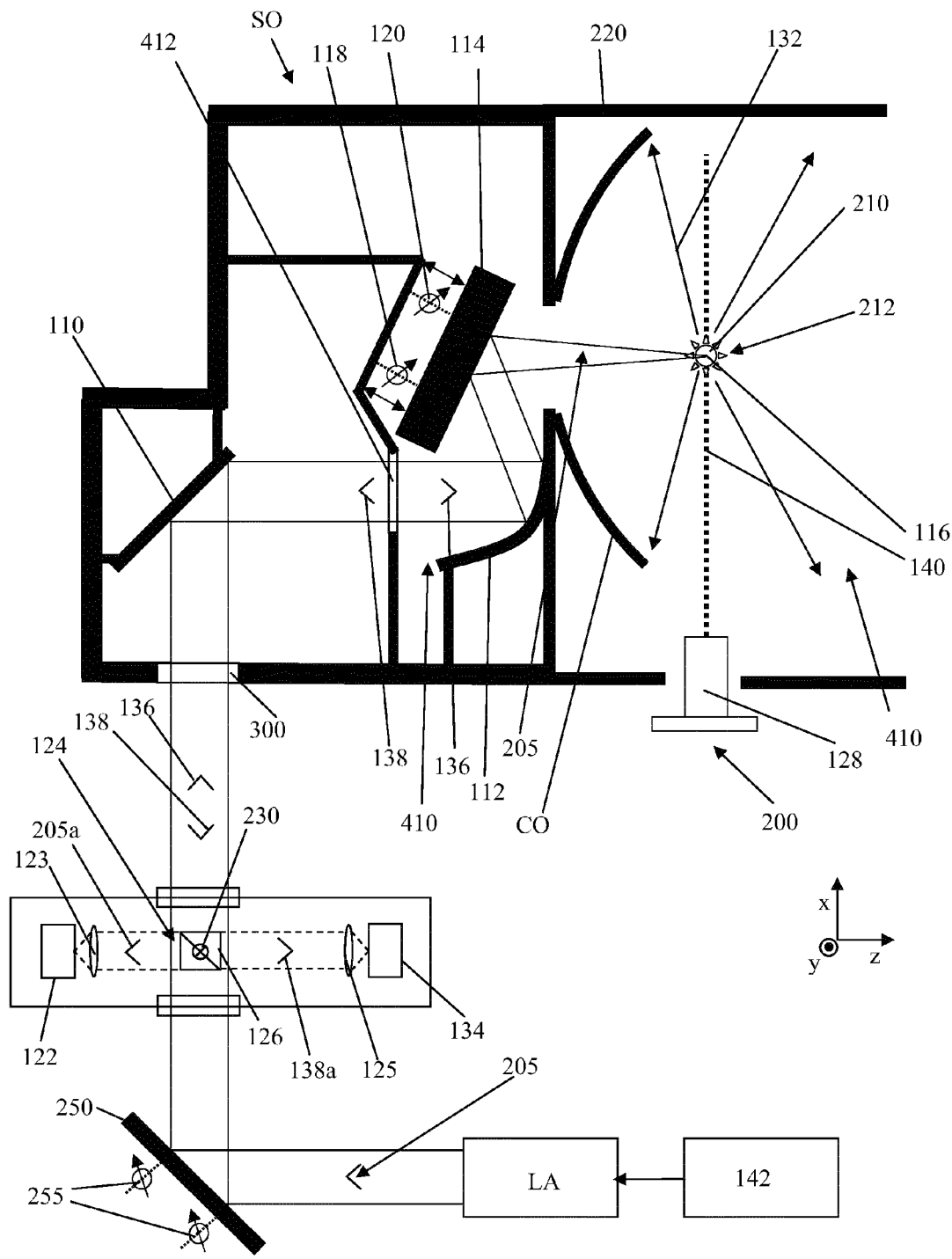
FIG. 4 shows a schematic plan view of a radiation source according to a second embodiment of the invention.

FIG. 4 shows a further embodiment of a radiation source according to the present invention. Features within the embodiment shown in FIG. 4 which are equivalent to those shown in the previous figures have been given the same numbering. In this embodiment, the radiation source comprises a second moveable reflector element 250 which forms part of a radiation directing device. The second moveable reflector element 250 of the radiation directing device is located in the path of the radiation beam 205 (also referred to as a first amount of radiation). The radiation directing device also comprises at least one reflector actuator that is mechanically linked to the reflector 250. In this case, the radiation directing device comprises two reflector actuators 255 which are mechanically linked to the second moveable reflector element 250. Movement of at least one of the reflector actuators 255 changes the orientation and/or position of the second moveable reflector element 250 relative to the path of the beam of radiation 205. In this way, the reflector actuator(s) 255 can be actuated in order to adjust the orientation and/or position of the second moveable reflector element 250 relative to the radiation beam 205 so as to alter the focus position 116 of the beam of radiation 205.

It will be appreciated that although two reflector actuators 255 have been shown in the present embodiment, in other embodiments there may be any appropriate number of reflector actuators provided there is at least one reflector actuator mechanically linked to the second moveable reflector element 250. Furthermore, it will be appreciated that in the present embodiment the reflector actuators 255 change the orientation and/or position of the second moveable reflector element 250 relative to the radiation beam 205. However, in other embodiments, the actuator(s) may alter any appropriate property of the second moveable reflector element that will alter the focus position of the radiation beam. For example, the actuator(s) may change the shape of the reflector. Although the radiation directing device of the present embodiment comprises a second moveable reflector element 250, in other embodiments the radiation directing device may comprise any appropriate directing element that is capable of altering the focus position of the radiation beam. For example, the radiation directing device may comprise a plurality of lens elements, the properties of each lens element being adjustable.

The radiation source has an alignment detector that comprises a first sensor arrangement 122, a second sensor arrangement 134 and a beam splitting apparatus 124. The alignment detector, and in particular the first sensor arrangement 122, the second sensor arrangement 134 and the beam splitting apparatus 124, all function as previously discussed in relation to the embodiment shown in FIG. 3. As with the embodiment shown in FIG. 3, the embodiment in FIG. 4 also includes first and second conversion optical elements 123, 125.

Within the embodiment shown in FIG. 4, the second moveable reflector element 250 and alignment detector (including first sensor arrangement 122, second sensor arrangement 134 and beam splitting apparatus 124) are both located exterior to a first chamber 410 in which the plasma formation location 212 is located. The first amount of radiation 205. The first chamber 410 may contain a vacuum or may contain a gas/mixture of gases that differs from that of the atmosphere. Due to the fact that the second moveable reflector element 250 and alignment detector are located exterior to the first chamber 410, they may be in an environment which is different to that within the first chamber 410. For example, the second moveable reflector element 250 and alignment detector may be located in the ambient (i.e. room) atmosphere.

The beam splitter 124 of the alignment detector is located downstream of the second moveable reflector element 250 having regard to the direction of propagation of the radiation beam 205.

In the embodiments shown in FIG. 3 or 4, the radiation source SO may also have a radiation source controller (not shown). The controller may use the first sensor signal (produced by the first sensor arrangement 122) to determine the focus position of the first amount of radiation. The controller may also use the first and second sensor signals (produced by the first sensor arrangement 122 and second sensor arrangement 134 respectively) to compare at least one property of the third amount of radiation to the same at least one property of the fourth amount of radiation. By comparing the at least one property of the third amount of radiation with the same at least one property of the fourth amount of radiation it is possible to determine or infer the relative alignment between the fuel droplet and the first amount of radiation.

The radiation source controller may be configured to control the relative alignment between the fuel droplet and the focus position of the first amount of radiation by controlling at least one of the following, based on the first and second sensor signals: the position of the nozzle relative to the remainder of the radiation source, and hence the trajectory of the stream of fuel droplets; the propagation direction of the first amount of radiation, and hence the focus position of the first amount of radiation; and the time at which the first amount of radiation is incident on the fuel droplet.

In order to control the propagation direction of the first amount of radiation, and hence the focus position of the first amount of radiation, the controller may provide a first control signal to the reflector actuators 118, 120 and a second control signal to the reflector actuators 255. The first control signal provided to the reflector actuators 118, 120 may control the orientation and/position of the directing reflector 114 relative to the path of the first amount of radiation 205. The second control signal provided to the reflector actuators 255 may control the orientation and/position of the second moveable reflector element 250 relative to the path of the first amount of radiation 205.

In some embodiments the controller, reflector actuators 118, 120 and reflector actuators 255 may be configured such that the control bandwidth for controlling the orientation and/position of the second moveable reflector element 250 relative to the path of the first amount of radiation 205 is greater than the control bandwidth for controlling the orientation and/position of the directing reflector 114 relative to the path of the first amount of radiation 205. That is to say that in some embodiments the rate at which the reflector actuators can be controlled so as to control the orientation and/position of the directing reflector 114 relative to the path of the first amount of radiation 205 may be less than the rate at which the at least on reflector element actuator can be controlled so as to control the orientation and/position of the second moveable reflector element 250 relative to the path of the first amount of radiation 205.

In some embodiments, the radiation source may additionally have an alignment radiation source (not shown) (such as, for example, a laser pointer), which is mounted to the secondary radiation source LA. This alignment radiation source and a corresponding sensor arrangement which measures the direction of propagation of radiation produced by the radiation source may be used to measure and control the alignment between the secondary radiation source LA and window 300 and/or reflector element 110.

Figure 5:
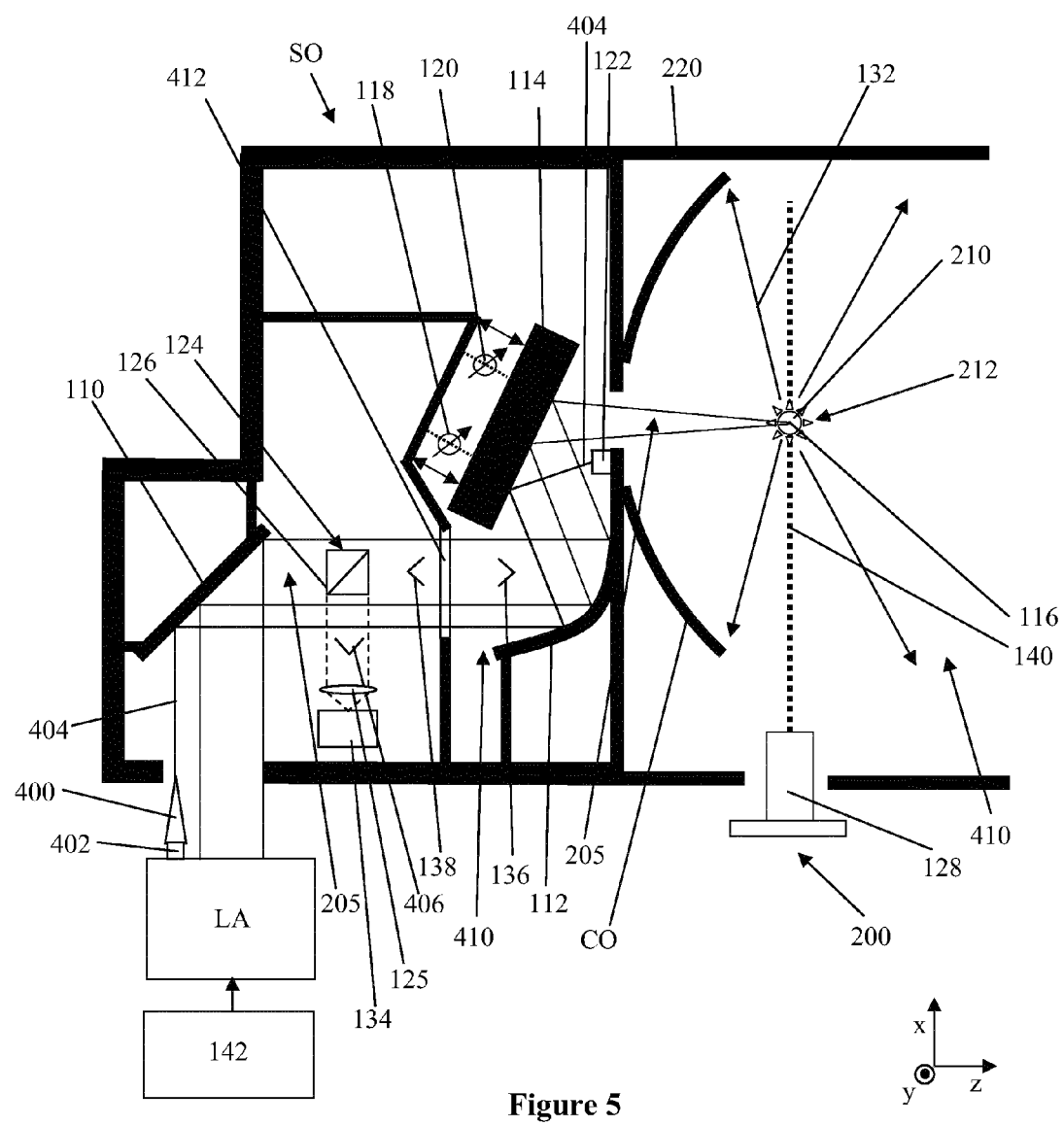
FIG. 5 shows a schematic plan view of a radiation source according to a third embodiment of the invention.

FIG. 5 shows an alternative radiation source in accordance with an embodiment of the present invention. Features of the radiation source shown in FIG. 5 that are equivalent to those of the radiation sources shown in FIGS. 3 and 4 have been given the same numbering.

Within the embodiment of the invention shown in FIG. 5, the alignment detector includes an alignment radiation source 400 (such as, for example, a laser pointer), which is mounted to the secondary radiation source LA by a mounting attachment 402. It will be appreciated that although the alignment radiation source is a laser pointer in the present embodiment, other embodiments may use any appropriate radiation source as the alignment radiation source. The alignment radiation source 400 produces the third amount of radiation 404. This differs from the embodiment shown in FIG. 3, in which the third amount of radiation is a portion of the first amount of radiation that is reflected by the beam splitter 126. The alignment radiation source 400 is mounted to the secondary radiation source LA such that the propagation direction of the third amount of radiation 404 is substantially parallel to the propagation direction of the first amount of radiation 205. It can be seen that the third amount of radiation 404 produced by the alignment radiation source 400 propagates adjacent the first amount of radiation such that the third amount of radiation 404 is also reflected by the fixed reflective elements 110 and 112 and the moveable reflective element 114. The first sensor arrangement of the alignment detector of the radiation source shown in FIG. 5 is located such that the third amount of radiation 404 is incident on the first sensor arrangement 122.

The third amount of radiation 404 may be produced by an alignment radiation source 400 that produces substantially collimated radiation. For example, the alignment radiation source 400 may be a laser. In this case, the third amount of radiation 404 will be substantially collimated. The third amount of radiation 404 may pass through a conversion optical element (not shown), for example, a converging lens, before it is incident on the first sensor arrangement 122. The conversion optical element (not shown) converges the collimated third amount of radiation 404 such that it is focused to a beam spot that is incident on the first sensor arrangement 122. The conversion optical element converts a spatial frequency distribution (e.g., the direction in which the beam is propagating) within the collimated beam of the third amount of radiation 404 into an intensity distribution (e.g., the position at which the focused beam spot is incident on the first sensor arrangement 122).

Due to the fact that the alignment radiation source 400 is mounted to the secondary radiation source LA such that the third amount of radiation 404 propagates in a direction that is substantially parallel to the direction of the propagation of the first amount of radiation 205 produced by the secondary radiation source LA, and because the third amount of radiation is reflected by the same reflector elements 110, 112 and 114 as the first amount of radiation 205, by measuring the position of the third amount of radiation 404 using the first sensor arrangement 122 it is possible to determine or infer the propagation direction of the first amount of radiation and/or the focus position 116 of the first amount of radiation 205.

The alignment detector shown in the embodiment of FIG. 5 is arranged such that the alignment radiation source is mounted to the secondary radiation source and such that the third amount of radiation travels towards the first sensor arrangement in a direction that is substantially parallel to the first amount of radiation. It will be appreciated that in other embodiments of the invention the alignment detector may be arranged such that the first sensor arrangement is mounted to the secondary radiation source and the alignment radiation source is mounted at a location downstream (with respect to the direction of travel of the first amount of radiation) of the radiation directing device. In this case, the third amount of radiation produced by the alignment radiation source will propagate in a direction that is substantially anti-parallel to the direction of propagation of the first amount of radiation.

Although the first sensor arrangement 122 of the radiation source shown in FIG. 5 is located at a position downstream of the radiation directing device such that the third amount of radiation 404 is reflected by reflectors 110, 112 and 114 before being incident on the first sensor arrangement 122, in other embodiments according to the invention, the first sensor arrangement may be located in any appropriate position. For example, the first sensor arrangement 122 may be located at a position downstream of the reflector 110, but upstream of reflector 112, such that the third amount of radiation is only reflected by reflector 110. The first sensor arrangement 122 may be located adjacent a beam splitting apparatus 124.

In common with the previously discussed embodiments of the invention, the embodiment of the invention shown in FIG. 5 includes a beam splitting apparatus 124, which is located such that at least part of the fourth amount of radiation (return beam 138) is incident on the beam splitting apparatus 124. The beam splitting apparatus 124 is configured so as to direct (in this case reflect) a least a portion 406 of the fourth amount of radiation so that the at least a portion 406 of the fourth amount of radiation is incident on the second sensor arrangement 134.

As previously described in relation to the embodiment shown in FIGS. 3 and 4, by comparing at least one property of the third amount of radiation 404 measured by the first sensor arrangement 122 with at least one property of the fourth amount of radiation 406 measured by the second sensor arrangement 134, it is possible to determine or infer the relative alignment between the fuel droplet and the focus position 116 of the first amount of radiation 205. Again, calibration of the radiation source may be required in order to determine or infer the relative alignment between the fuel droplet and the focus position 116 of the first amount of radiation 205.

As before, the first sensor arrangement and second sensor arrangement may supply respective first and second control signals to a controller such that the controller can control the relative alignment between the focus position of the first amount of radiation and the fuel droplet.

The radiation sources shown in FIGS. 3 and 4, in accordance with first and second embodiments of the present invention, have an alignment detector that includes a beam splitting apparatus 124, the first sensor arrangement 122 and the second sensor arrangement 134. The radiation source shown in FIG. 5, in accordance with a further embodiment of the present invention, has an alignment detector including the alignment radiation source 400, the beam splitting arrangement 124, the first sensor arrangement 122 and the second sensor arrangement 134.

The radiation sources shown in FIGS. 3, 4 and 5 have a first chamber 410 (defined at least in part by the enclosing structure 220) in which the plasma formation location 212 is located. The first amount of radiation 205 and fourth amount of radiation 138 pass between the first chamber 410 and the exterior to the first chamber via window 412. The first chamber 410 may contain a vacuum or may contain a gas/mixture of gases that differs from that of the atmosphere. It can be seen that the radiation sources shown in FIGS. 3, 4 and 5 are configured such that the alignment detector is located outside of the first chamber 410.

The ability to locate the alignment detector exterior to the first chamber 410 may be advantageous in some applications. For example, if the first chamber 410 contains a vacuum then it may be disadvantageous to position at least part of the alignment detector within the first chamber 410. This is because when the first chamber 410 contains a vacuum, it may be difficult to access the first chamber 410. For example, it may be necessary to pump gas into the first chamber 410 so as to remove the vacuum before accessing the first chamber 410. This process may take a considerable time during which it will not be possible to operate the lithographic apparatus. Consequently, the throughput of the lithographic apparatus will be reduced. If at least a portion of the alignment detector is located within the first chamber 410 in the case where the first chamber contains a vacuum, then should the at least part of the alignment detector located within the first chamber 410 require replacement or maintenance, then it may be necessary to access the first chamber to provide such a replacement or maintenance, which will result in the reduction in the throughput of the lithographic apparatus as previously discussed.

The ability to locate the alignment detector exterior to the first chamber 410 may also be advantageous due to the fact that the environmental conditions within the first chamber 410 may be adverse to the operating performance of the alignment detector. For example, the first chamber 410, due to the fact that it contains the plasma formation location 212, may contain fuel droplet debris that is formed when the radiation producing plasma is generated. If the alignment detector was located in the first chamber then the alignment detector may be exposed to the fuel droplet debris and hence part of the alignment detector (such as the beam splitting arrangement or sensor arrangements) may be contaminated the fuel droplet debris such that the operating performance of the alignment detector is adversely affected. Furthermore, the first chamber 410 may contain high levels of radiation produced by the radiation producing plasma. If the alignment detector was located in the first chamber then the alignment detector may be exposed to the high levels of radiation produced by the radiation producing plasma. The high levels of radiation produced by the radiation producing plasma may cause part of the alignment detector (such as the beam splitting arrangement or sensor arrangements) to degrade or be damaged by the radiation produced by the radiation producing plasma such that the operating performance of the alignment detector is adversely affected. By locating the alignment detector exterior to the first chamber 410 (and hence locating the alignment detector exterior to the environmental conditions within the first chamber 410 may be adverse to the operating performance of the alignment detector) it is possible to use a wider range of types of sensor arrangement and optical components as part of the alignment detector because they will not have to withstand the adverse environmental conditions within the first chamber.

Figure 6:
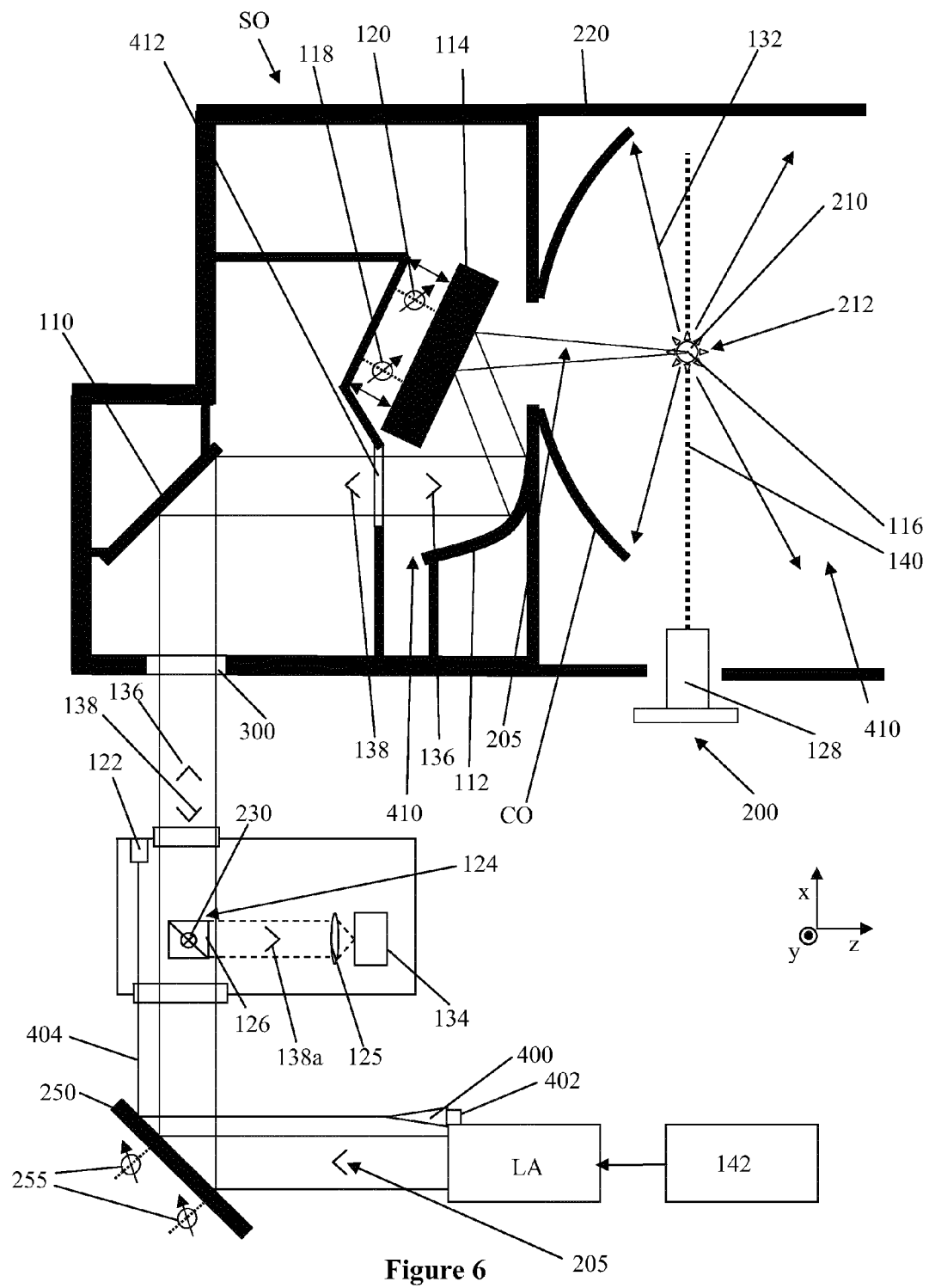
FIG. 6 shows a schematic plan view of a radiation source according to a fourth embodiment of the invention.

FIG. 6 shows a further embodiment of the present invention, which is a modification of the embodiment shown in FIG. 5. Features of the radiation source shown in FIG. 6 that are equivalent to those of the radiation source shown in FIG. 5 have been given the same numbering.

In a similar manner to the embodiment shown in FIG. 5, within the embodiment of the invention shown in FIG. 6, the alignment detector includes an alignment radiation source 400 (such as, for example, a laser pointer), which is mounted to the secondary radiation source LA by a mounting attachment 402. It will be appreciated that although the alignment radiation source is a laser pointer in the present embodiment, other embodiments may use any appropriate radiation source as the alignment radiation source. As before, the alignment radiation source 400 produces the third amount of radiation 404. This differs from the embodiment shown in FIG. 3, in which the third amount of radiation is a portion of the first amount of radiation that is reflected by the beam splitter 126. The alignment radiation source 400 is mounted to the secondary radiation source LA such that the propagation direction of the third amount of radiation 404 is substantially parallel to the propagation direction of the first amount of radiation 205.

In a similar manner to the embodiment shown in FIG. 4, in the embodiment shown in FIG. 6 the radiation source comprises a second moveable reflector element 250 which forms part of a radiation directing device. The second moveable reflector element 250 of the radiation directing device is located in the path of the radiation beam 205. The radiation directing device also comprises at least one reflector actuator that is mechanically linked to the reflector 250. In this case, the radiation directing device comprises two reflector actuators 255 which are mechanically linked to the second moveable reflector element 250. As before, movement of at least one of the reflector actuators 255 changes the orientation and/or position of the second moveable reflector element 250 relative to the path of the beam of radiation 205. In this way, the reflector actuator(s) 255 can be actuated in order to adjust the orientation and/or position of the second moveable reflector element 250 relative to the radiation beam 205 so as to alter the focus position 116 of the beam of radiation 205.

It will be appreciated that although two reflector actuators 255 have been shown in the present embodiment, in other embodiments there may be any appropriate number of reflector actuators provided there is at least one reflector actuator mechanically linked to the second moveable reflector element 250. Furthermore, it will be appreciated that in the present embodiment the reflector actuators 255 change the orientation and/or position of the second moveable reflector element 250 relative to the radiation beam 205. However, in other embodiments, the actuator(s) may alter any appropriate property of the second moveable reflector element that will alter the focus position of the radiation beam. For example, the actuator(s) may change the shape of the reflector. Although the radiation directing device of the present embodiment comprises a second moveable reflector element 250, in other embodiments the radiation directing device may comprise any appropriate directing element that is capable of altering the focus position of the radiation beam. For example, the radiation directing device may comprise a plurality of lens elements, the properties of each lens element being adjustable.

The radiation source has an alignment detector that comprises a first sensor arrangement 122, a second sensor arrangement 134 and a beam splitting apparatus 124. The alignment detector, and in particular the first sensor arrangement 122, the second sensor arrangement 134 and the beam splitting apparatus 124, all function as previously discussed in relation to the embodiment shown in FIG. 5. As with the embodiment shown in FIG. 5, the embodiment in FIG. 6 also includes a conversion optical element 125.

It can be seen that the third amount of radiation 404 produced by the alignment radiation source 400 propagates adjacent the first amount of radiation such that the third amount of radiation 404 is also reflected by the second moveable reflector element 250. The first sensor arrangement of the alignment detector of the radiation source shown in FIG. 5 is located such that the third amount of radiation 404 is incident on the first sensor arrangement 122.

As previously discussed, the third amount of radiation 404 may be produced by an alignment radiation source 400 that produces substantially collimated radiation. For example, the alignment radiation source 400 may be a laser. In this case, the third amount of radiation 404 will be substantially collimated. The third amount of radiation 404 may pass through a conversion optical element (not shown), for example, a converging lens, before it is incident on the first sensor arrangement 122. The conversion optical element (not shown) converges the collimated third amount of radiation 404 such that it is focused to a beam spot that is incident on the first sensor arrangement 122. The conversion optical element converts a spatial frequency distribution (e.g., the direction in which the beam is propagating) within the collimated beam of the third amount of radiation 404 into an intensity distribution (e.g., the position at which the focused beam spot is incident on the first sensor arrangement 122).

Due to the fact that the alignment radiation source 400 is mounted to the secondary radiation source LA such that the third amount of radiation 404 propagates in a direction that is substantially parallel to the direction of the propagation of the first amount of radiation 205 produced by the secondary radiation source LA, and because the third amount of radiation is reflected by the same reflector 250 as the first amount of radiation 205, by measuring the position of the third amount of radiation 404 using the first sensor arrangement 122 it is possible to determine or infer the propagation direction of the first amount of radiation and/or the focus position 116 of the first amount of radiation 205.

The alignment detector shown in the embodiment of FIG. 6 is arranged such that the alignment radiation source is mounted to the secondary radiation source and such that the third amount of radiation travels towards the first sensor arrangement in a direction that is substantially parallel to the first amount of radiation. It will be appreciated that in other embodiments of the invention the alignment detector may be arranged such that the first sensor arrangement is mounted to the secondary radiation source and the alignment radiation source is mounted at a location downstream (with respect to the direction of travel of the first amount of radiation) of the radiation directing device (i.e. the second movable reflector element 250). In this case, the third amount of radiation produced by the alignment radiation source will propagate in a direction that is substantially anti-parallel to the direction of propagation of the first amount of radiation.

Although the first sensor arrangement 122 of the radiation source shown in FIG. 6 is located at a position downstream of the second movable reflector element 250 and upstream of the reflector 110, in other embodiments according to the invention, the first sensor arrangement may be located in any appropriate position. For example, the first sensor arrangement 122 may be located at a position downstream of the reflector 110, such that the third amount of radiation is reflected by both the second movable reflector element 250 and the reflector 110. Or, for example, the first sensor arrangement may be located adjacent window 300.

As previously discussed, the first sensor arrangement and second sensor arrangement may supply respective first and second control signals to a controller such that the controller can control the location of the focus position of the first amount of radiation and the relative alignment between the focus position of the first amount of radiation and the fuel droplet. Control of the focus the focus position of the first amount of radiation and the relative alignment between the focus position of the first amount of radiation may involve the controller sending control signals to the actuators 255 and/or the actuators 118, 120 so as to control the position/ orientation of the reflector element 250 and or reflector 114 respectively in a manner as previously discussed in relation to the other embodiments of the invention.

Within the embodiment shown in FIG. 6, the second moveable reflector element 250 and alignment detector (including first sensor arrangement 122, second sensor arrangement 134 and beam splitting apparatus 124) are both located exterior to a first chamber 410 in which the plasma formation location 212 is located. The first chamber 410 may contain a vacuum or may contain a gas/mixture of gases that differs from that of the atmosphere. Due to the fact that the second moveable reflector element 250 and alignment detector are located exterior to the first chamber 410, they may be in an environment which is different to that within the first chamber 410. For example, the second moveable reflector element 250 and alignment detector may be located in the ambient (i.e. room) atmosphere or located in a purged environment (i.e. an environment that contains substantially only a purge gas (such as nitrogen) or a mixture of purge gases which has/have been used to displace atmospheric gases).

The beam splitter 124 of the alignment detector is located downstream of the second moveable reflector element 250 having regard to the direction of propagation of the radiation beam 205.

In any of the embodiments discussed above, it may be necessary to initially calibrate the radiation source or subsequently recalibrate the radiation source. For example, it may be necessary to subsequently recalibrate the radiation source due to mechanical movement of the radiation source or thermal movement of at least part of the radiation source. As an example, it may be necessary to calibrate the alignment detector, including the first sensor arrangement and the second sensor arrangement (and possibly also the timing controller of the secondary radiation source), such that the radiation source can be controlled so as to effectively control the alignment between the focus of the first amount of radiation and the fuel droplet. The calibration of the radiation source may involve providing the radiation source controller with information as to how the output of the first and second sensor arrangements (i.e., the first and second sensor signals respectively), which are provided to the radiation source controller, relate to the actual position of the focus of the first amount of radiation and the position of the fuel droplet relative to the alignment detector respectively.

For example, during calibration of the radiation source, the focus position 116 of the first amount of radiation 205 may be adjusted so that it is at a desired position. The output of the first sensor arrangement (i.e., the first sensor signal) whilst the focus position of the first amount of radiation is a the desired position may then be stored by the controller. The focus position of the first amount of radiation may be adjusted by actuating the reflector actuators 118, 120 and/or the actuators 255 of the radiation directing device so as to change the orientation, position or shape of the directing reflector 114 and/or of the reflector 250 and thereby alter the path of the first amount of radiation. In addition, the timing of the secondary radiation source LA and/or the position of the nozzle relative to the remainder of the radiation source (and hence the trajectory of the stream of fuel droplets) may be adjusted so as to achieve a desired fuel droplet position relative to alignment detector and/or a desired relative alignment between the focus position of the first amount of radiation and the fuel droplet. When the fuel droplet position relative to alignment detector is a desired position and/or the relative alignment between the focus position of the first amount of radiation and the fuel droplet is a desired alignment, the output of the second sensor arrangement (i.e., the second sensor signal) may be stored by the controller. It will be appreciated that although these calibration steps have been described in a particular order in relation to the current embodiment of the invention, in other embodiments the steps may be carried out in any appropriate order or simultaneously.

In some embodiments of the present invention, during calibration of the radiation source, the focus position 116 of the first amount of radiation 205 may be adjusted so that it is at a desired position. The focus position of the first amount of radiation may be adjusted by actuating the reflector actuators 118, 120 and/or the actuators 255 of the radiation directing device so as to change the orientation, position or shape of the directing reflector 114 and/or of the reflector 250 and thereby alter the path of the first amount of radiation. In addition, the timing of the secondary radiation source LA and/or the position of the nozzle relative to the remainder of the radiation source (and hence the trajectory of the stream of fuel droplets) may be adjusted so as to achieve a desired fuel droplet position relative to alignment detector and/or a desired relative alignment between the focus position of the first amount of radiation and the fuel droplet. When the focus position of the first amount of radiation is the desired position, and when the fuel droplet position relative to alignment detector is the desired position and/or the relative alignment between the focus position of the first amount of radiation and the fuel droplet is the desired relative alignment, the controller may store a difference between the output of the first sensor arrangement and the output of the second sensor arrangement.

For example, if the first and second sensor arrangements are position sensitive detectors that each output a sensor signal that is indicative of the centre of a beam of radiation that is incident upon it, the controller may perform a vector subtraction of the position of the centre of the beam of the third amount of radiation incident on the first sensor arrangement, from the position of the centre of the beam of the fourth amount of radiation incident on the second sensor arrangement. The vector difference between the position of the centre of the beam of the third amount of radiation measured by the first sensor arrangement and the position of the centre of the beam of the fourth amount of radiation measured the second sensor arrangement may then be stored by the controller.

During calibration, in order to determine the desired the focus position of the first amount of radiation, the desired fuel droplet position relative to alignment detector and/or the desired relative alignment between the focus position of the first amount of radiation and the fuel droplet; the controller may control at least one of the orientation, position and/or shape of the directing reflector and/or of the second movable reflector element, the timing of the secondary radiation source and/or the trajectory of the stream of fuel droplets. The controller may control at least one of the orientation, position and/or shape of the directing reflector and/or of the second movable reflector element, the timing of the secondary radiation source and/or the trajectory of the stream of fuel droplets such that the second amount of radiation produced by the radiation producing plasma has a desired property. Examples of such a desired property of the second amount of radiation produced by the radiation producing plasma include a desired total intensity, the maximum total intensity achievable by a particular radiation source, and a desired intensity distribution.

After calibration has been completed, in embodiments in which separate outputs of the first and second sensor arrangements are stored by the controller during calibration, the controller may control at least one of the following, based on the first and second sensor signals, so as to minimize the difference between the stored first and/or second sensor signal and the respective first and/or second sensor signal at a given moment in time: the position of the nozzle relative to the remainder of the radiation source (and hence the trajectory of the stream of fuel droplets); a propagation direction of the first amount of radiation (and hence the focus position of the first amount of radiation); and the time at which the first amount of radiation is incident on the fuel droplet.

Alternatively, in embodiments in which a difference between the output of the first sensor arrangement and the output of the second sensor arrangement is stored by the controller during calibration, the controller may control at least one of the following, based on the first and second sensor signals, so as to minimize the difference between the stored difference between the output of the first sensor arrangement and the output of the second sensor arrangement and the respective difference between the output of the first sensor arrangement and the output of the second sensor arrangement at a given moment in time: the position of the nozzle relative to the remainder of the radiation source (and hence the trajectory of the stream of fuel droplets); a propagation direction of the first amount of radiation (and hence the focus position of the first amount of radiation); and the time at which the first amount of radiation is incident on the fuel droplet.

In order to control the position of the nozzle relative to the remainder of the radiation source, the controller may provide a control signal to the actuator that is mechanically linked to the fuel supply 200 and hence the nozzle 128. In order to control the propagation direction of the first amount of radiation the controller may provide control signals to the radiation directing device, and in particular the actuators 118 and 120 of the radiation directing device. In order to control the time at which the first amount of radiation is incident on the fuel droplet, the controller may provide a control signal to the timing controller.

In embodiments in which separate outputs of the first and second sensor arrangements are stored by the controller during calibration, by controlling the radiation source in this way, the controller may operate so as to continually minimize the difference between the measured first and second sensor signals at any given time and the respective first and second sensor signals that were stored by the controller during the calibration process. Consequently, the controller may operate so as to ensure that the difference between the desired focus position of the first amount of radiation and the focus position of the first amount of radiation at any given time is minimized. The controller may further operate so as to minimize the difference between the fuel droplet position relative to the alignment detector at any given time, and the desired fuel droplet position relative to the alignment detector. Furthermore, the controller may operate so as to minimise the difference between the relative alignment between the focus position of the first amount of radiation and the fuel droplet at any given time, and the desired relative alignment between the focus position of the first amount of radiation and the fuel droplet.

Alternatively, in embodiments in which a difference between the output of the first sensor arrangement and the output of the second sensor arrangement is stored by the controller during calibration, by controlling the radiation source in this way, the controller may operate so as to continually minimize the difference between the measured difference between the output of the first sensor arrangement and the output of the second sensor arrangement and the difference between the output of the first sensor arrangement and the output of the second sensor arrangement that was stored by the controller during the calibration process. Consequently, the controller may operate so as to ensure that the difference between the desired focus position of the first amount of radiation and the focus position of the first amount of radiation at any given time is minimized. The controller may further operate so as to minimize the difference between the fuel droplet position relative to the alignment detector at any given time, and the desired fuel droplet position relative to the alignment detector. Furthermore, the controller may operate so as to minimise the difference between the relative alignment between the focus position of the first amount of radiation and the fuel droplet at any given time, and the desired relative alignment between the focus position of the first amount of radiation and the fuel droplet.

The radiation source according to the present invention differs from known radiation sources in several ways. First the prior art radiation sources detect a property (for example the intensity distribution) of the radiation emitted by the radiation producing plasma in order to try to determine information about the relative alignment between the fuel droplet and the focus position of the first amount of radiation. The radiation source according to the present invention independently measures a property of the third amount of radiation, which is indicative of the focus position of the first amount of radiation; and a property of the fourth amount of radiation (the fourth amount of radiation being a portion of the first amount of radiation that is reflected by the fuel droplet), which is indicative of the position of the fuel droplet relative to the alignment detector.

Both the third amount of radiation and the fourth amount of radiation are separate to the second amount of radiation that may be emitted by the radiation generating plasma. It may therefore be said that the relative alignment between the fuel droplet and the focus position of the first amount of radiation is measured directly; i.e., without the need to try to determine the relative alignment between the fuel droplet and the focus position of the first amount of radiation by measuring at least a property of the second amount of radiation that is emitted by the radiation generating plasma.

The alignment detector of a radiation source according to the present invention makes two separate measurements: a first measurement using the first sensor arrangement and a second measurement using the second sensor arrangement. This allows the radiation source to both determine the focus position of the first amount of radiation (by using the output of the first sensor arrangement), and to determine the position of the fuel droplet relative to the alignment detector (by using the output of the second sensor arrangement). The radiation source may also be able to determine the relative alignment between the fuel droplet and the focus position of the first amount of radiation (by using the output of both the first and second sensor arrangements). Known radiation sources are not capable of determining both the focus position of the first amount of radiation and the position of the fuel droplet relative to the alignment detector (and hence the position of the fuel droplet relative to other portions of the radiation source).

The radiation source according to the present invention, by determining both the focus position of the first amount of radiation and the position of the fuel droplet relative to the alignment detector, may allow the radiation source to control not only the relative alignment between the focus position of the first amount of radiation and the fuel droplet, but also the location of the plasma formation location relative to the radiation collector CO. The ability to control these factors separately means that, compared to the prior art, not only is there a greater accuracy in determining and controlling the relative alignment between the focus position of the first amount of radiation and the fuel droplet, but also there is greater control in the properties (for example intensity distribution) of the radiation that is output by the radiation producing plasma (and hence the radiation source).

Unlike the prior art, in order to determine/control the relative alignment between the focus position of the first amount of radiation and the fuel droplet the radiation source according to the present invention does not measure a property of the radiation output by the radiation producing plasma. Instead, a radiation source according to the present invention measures a property of the third amount of radiation and a property of the return beam. It follows that in order to determine the relative alignment between the focus position of the first amount of radiation and the fuel droplet, the radiation source according to the present invention does not require radiation to be produced by the radiation producing plasma. This may lead to reduced start-up and/or recovery time for a lithographic apparatus that includes a radiation source according to the present invention. However, it will be appreciated that in order for a measurement of a property of the main beam to be taken, some radiation must be supplied to the fuel droplet such that radiation can be reflected by the fuel droplet so as to form the return beam.

Also, because a property the radiation output by the radiation producing plasma is not measured by a radiation source according to the present invention in order to determine the relative alignment between the focus position of the first amount of radiation and the fuel droplet, the sensors used to measure the relative alignment are not exposed to the radiation output by the radiation producing plasma. In this way, if the radiation output by the radiation producing plasma is damaging to sensors, then the sensors will not be exposed to this damaging radiation.

Furthermore, the alignment detector of the present invention, and in particular, the first and second sensor arrangements are located such that they are not in proximity to the radiation producing plasma. Consequently the alignment detector, and in particular, the first and second sensor arrangements are not exposed to heat and/or debris from the radiation producing plasma that may damage or degrade the sensor arrangements.

Furthermore, the radiation source according to the present invention will be suitable for use with radiation generating methods that utilise a pre-pulse and a main pulse. A radiation source according to the present invention also allows independent measurement and control of the focus position of each of the pre-pulse and main-pulse. Furthermore, a radiation source according to the present invention may allow independent measurement and control of the position of the fuel droplet relative to the alignment detector; and position of the modified fuel distribution relative to the alignment detector. Moreover, a radiation source according to the present invention may further allow independent measurement and control of the relative alignment between the pre-pulse and the fuel droplet; and the relative alignment between the modified main-pulse and the modified fuel distribution. In a radiation source according to some embodiments of the present invention, the focus position of each of the pre-pulse and main-pulse may be controlled such that they are at different positions.

In embodiments of the invention in which each of the pre-pulse and main-pulse may be controlled such that they are at different positions and/or in which the position of the fuel droplet relative to the alignment detector and position of the modified fuel distribution relative to the alignment detector may be controlled separately, the same alignment detector may be used to measure properties of the pre-pulse/fuel droplet and of the main-pulse/modified fuel distribution. Two examples of the way in which this may be achieved are as follows. First, the pre-pulse and main-pulse may be produced at different times (the main-pulse is produced after the pre-pulse). Consequently, the controller can be configured such that it receives a first set of sensor outputs and provides a first set of control signals that relate to the pre-pulse and then, at a later time, the controller receives a second set of sensor outputs and provides a second set of control signals that relate to the main-pulse. Alternatively, or in addition, the pre-pulse and main-pulse may be amounts of radiation that have different frequencies/wavelengths. Consequently, in this case, the controller may be configured to receive a first set of control signals from the sensor arrangements relating to measured radiation having a first frequency/wavelength corresponding to the frequency/wavelength of the pre-pulse, and to receive a second set of signals from the sensor arrangements relating to measured radiation having a second frequency/wavelength corresponding to the frequency/wavelength of the main-pulse. In this way, the controller receives the first set of signals from the sensor arrangements relating to the pre-pulse and receives the second set of signals from the sensor arrangements relating to the main-pulse. The controller can then control the alignment/positioning of the pre-pulse/fuel droplet and the main-pulse/modified fuel distribution independently as discussed above.

As the pre-pulse and the main-pulse may be amounts of radiation having different frequencies/wavelengths, the alignment detector may comprise respective sensors suitable for detecting radiation having the different frequencies/wavelengths. That is, the alignment detector may comprise sensors suitable for detecting radiation having a frequency/wavelength of the pre-pulse and separate sensors suitable for detecting radiation having a frequency/wavelength of the main-pulse. Alternatively, the alignment detector may comprise sensors which can detect radiation having both the frequency/wavelength of the pre-pulse and the frequency/wavelength main-pulse.

As discussed above, a property of the fourth amount of radiation (known as a return beam) detected by the second sensor arrangement 134 is indicative of the position of the fuel droplet. In embodiments in which the pre-pulse causes modification in the fuel distribution of the fuel droplet, the fuel distribution may be such that an insufficient, or unusable, fourth amount of radiation is produced by the interaction of the main-pulse with the modified fuel distribution. In such embodiments, a relative alignment between the main-pulse and the modified fuel distribution may be determined by a comparison of the measurements made by the second first sensor arrangement 122 of a property of the third amount of radiation for both a pre-pulse and a subsequent main-pulse. In other embodiments, the modifications in the fuel distribution of the fuel droplet are not such that an insufficient, or unusable, fourth amount of radiation is produced, such that a relative alignment between the main-pulse and the modified fuel distribution may be determined by measurements, made by the second sensor arrangement 134, of a fourth amount of radiation (i.e. return beam) of the main-pulse.

As previously discussed, the radiation source according to the present invention has the ability to control the focus position by controlling the reflector actuators. Similarly, the fuel droplet position can be controlled by changing the trajectory of the fuel droplet. This is achieved by controlling the actuator that is mechanically linked to the fuel supply and hence the nozzle. Finally, the timing controller can be controlled so as to determine the time at which the first amount of radiation (radiation beam) reaches the focus position. By controlling the focus position, the fuel droplet position, and the time at which the first amount of radiation (radiation beam) reaches the focus position, it is possible to control the relative alignment between the focus position and the fuel droplet.

Within the previously described embodiments, the beam splitting apparatus is located in a portion of the beam of the first amount of radiation that is substantially collimated. The radiation that is directed by the beam splitting apparatus so that it is incident on either the first or second sensor arrangement passes through a conversion optical element (in this case a converging lens) that performs an optical Fourier transform and hence converts a spatial frequency distribution (e.g., the direction in which the beam is propagating) within the collimated beam into an intensity distribution (e.g., the position at which the focused beam spot is incident on the relevant sensor arrangement). It will be appreciated that any appropriate optical element (or combination of optical elements) may constitute a conversion optical element that is used to convert the spatial frequency distribution of the substantially collimated beam into an intensity distribution. It will further be appreciated that the beam splitting apparatus may be located at any appropriate position in the path of the first amount of radiation. For example, the beam splitting apparatus may be located upstream or downstream from its location in the previously described embodiments. The beam splitting apparatus may be located in a portion of the beam of the first amount of radiation that is not substantially collimated (for example, in a portion of the beam of the first amount of radiation that is converging). In this case, further optics in addition to the conversion optical element(s) may be required.

It will be appreciated that in some embodiments of the invention it may be advantageous to locate the beam splitter apparatus such that it is not in a location that has a direct line of sight (i.e., a line of sight in the absence of reflectors etc.) to the plasma formation location. This will reduce the possibility that radiation and/or debris produced at the plasma formation location will be incident on the beam splitter apparatus. Debris and/or radiation produced by the radiation emitting plasma that is incident on the beam splitter apparatus may reduce the operating performance of the alignment detector, for example, by contaminating the beam splitter apparatus with debris (and hence reducing the amount of radiation that can be transmitted through the beam splitting apparatus) or by degrading the beam splitter apparatus and/or sensor arrangements.

The radiation source according to an embodiment of the invention shown in FIG. 3 measures a property of a third amount of radiation that is split from the first amount of radiation by the beam splitting apparatus. The radiation source according to an embodiment of the invention shown in FIG. 5 measures a property of a third amount of radiation that is produced by the alignment radiation source. In both cases the measured property of the third amount of radiation is indicative of the focus position of the first amount of radiation. In some embodiments of a radiation source according to the present invention, the alignment detector may combine features of both the embodiment shown in FIG. 3 and the embodiment shown in FIG. 5. For example, the alignment detector may be capable of both measuring a property of a third amount of radiation that is split from the first amount of radiation by the beam splitting apparatus and measuring a property of a separate or alternative third amount of radiation that is produced by an alignment radiation source.

In some embodiments of the invention which incorporate a second moveable reflector element 250 (which forms part of a radiation directing device), the reflector element 114 may be fixed (i.e. non-movable).

Figure 7:
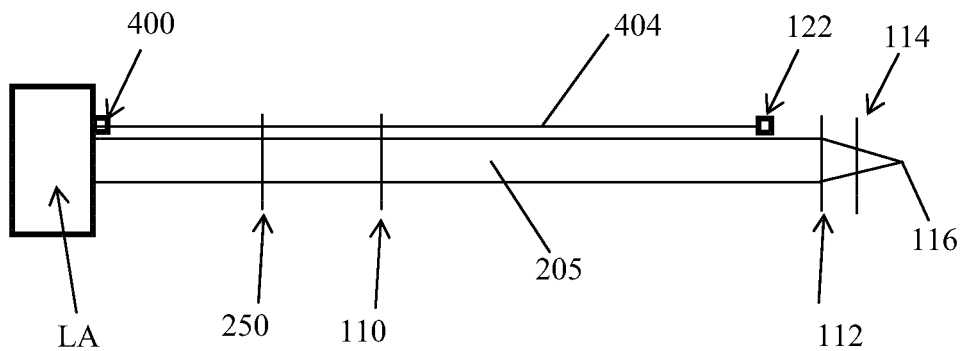
FIG. 7 shows a schematic diagram of a modified portion of the radiation source shown in FIG. 6.

FIG. 7 shows a schematic view of a modified portion of the radiation source shown in FIG. 6. This view shows the path of the beam of radiation 205 from the secondary radiation source (in this case laser LA) to the focus position 116. The schematic view of the path of the beam of radiation does not show the change in direction of the beam of radiation 205 when it is incident on the reflector elements 250, 110, 112 and 114. It can be seen that, in this case, reflective element 112 causes the beam of radiation 205 to converge to a focus at the focus position 116. In this embodiment reflective elements 250 and 114 are movable such that the path of the beam of radiation 205 and hence the focus position 116 of the beam of radiation 205 can be changed and hence controlled. As previously discussed, the number, layout and nature of the reflective elements which form part of the radiation source may be different in other embodiments. Any appropriate number and configuration of reflective elements (or other appropriate equivalent optical elements which can change the direction of the first amount of radiation) may be used so as to collectively direct and focus the beam of radiation 205 at a desired focus position 116.

FIG. 7 also shows the path of the third amount of radiation 404 as it travels between the alignment radiation source 400 and the first sensor arrangement 122. As previously discussed, it can be seen that the path of the third amount of radiation 404 is parallel to the path of the beam of radiation 205. The arrangement shown in FIG. 7 differs from that shown in FIG. 6 in that the first sensor arrangement 122 within FIG. 7 is located between (with respect to the path of the third amount of radiation) reflective elements 110 and 112 in FIG. 7, whereas in FIG. 6 the first sensor arrangement 122 is located between (with respect to the path of the third amount of radiation) reflective elements 250 and 110. Consequently, in FIG. 7, the third amount of radiation 404 produced by the alignment radiation source 400 propagates adjacent the first amount of radiation (beam of radiation 205) such that the third amount of radiation 404 is also reflected by the reflective elements 110 and 250. It will be appreciated that in other embodiments, the first sensor arrangement may be located at any appropriate position (for example, between (with respect to the path of the third amount of radiation) reflective elements 250 and 110, as shown in FIG. 6.

In some embodiments, the arrangement shown in FIG. 7 may suffer from several disadvantages.

For example, due to the fact that the third amount of radiation 404 travels adjacent the beam of radiation 205 and is incident on the reflective elements 250 and 110, the reflective elements 205 and 110 need to be larger than that required to reflect/direct the beam of radiation 205 on its own because additional space (or footprint) is required on the reflective elements 250, 110 in order to deflect the third amount of radiation 404 adjacent the beam of radiation 205. The increased size of reflective element 250, 110 may lead to the reflective elements being more expensive to produce and/or requiring more space within the radiation source. The requirement of more space within the radiation source may be disadvantageous in embodiments of the radiation source in which space is limited.

Another disadvantage in some embodiments is as follows. It is desirable to direct the third amount of radiation 404 such that the spacing between the third amount of radiation and first amount of radiation is minimized. This is done to reduce the size of the reflective element required and also to ensure that the path travelled by the third amount of radiation 404 is as similar as possible to the path travelled by the beam of radiation 205. Ensuring that the path travelled by the third amount of radiation 404 is as similar as possible to the path travelled by the beam of radiation 205 may improve the accuracy of using the third amount of radiation 404 in order to determine the focus position of the beam of radiation 205. It is also desirable to keep the first sensor arrangement 122 out of the beam of radiation 205 such that the beam of radiation 205 is not incident on the first sensor arrangement 122 thereby interfering with the measurement by the first sensor arrangement 122 of the property of the third amount of radiation 404. Due to the fact that it is desirable to direct the third amount of radiation 404 such that the spacing between the third amount of radiation and first amount of radiation is minimized and due to the fact that it is desirable to keep the first sensor arrangement 122 out of the beam of radiation 205 there may not be much space available for the first sensor arrangement 122. In some embodiments, this may make constructing the first sensor arrangement 122 and locating the first sensor arrangement 122 in a correct position very difficult.

Figure 8:
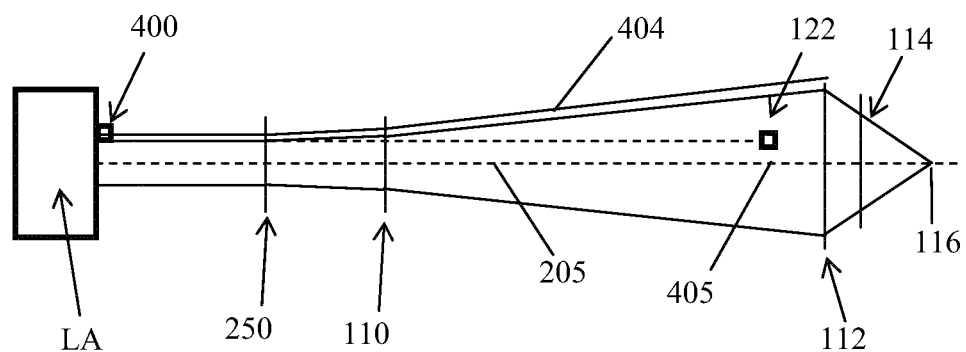
FIG. 8 shows a schematic diagram of the portion of the radiation source shown in FIG. 7 in a diverging beam condition.

A further possible disadvantage of the embodiment shown in FIG. 7 is explained with reference to FIG. 8. Within FIG. 7, the beam of radiation 205 produced by the secondary radiation source LA is a substantially parallel beam of radiation. However, as shown in FIG. 8, in some embodiments the beam of radiation 205 may be divergent. This divergence may be caused by the shape of the reflective elements 250, 110. For example, the reflective elements 250, 110 may exhibit a configuration which has a generally part spherical reflective surface. One potential way in which the reflective elements 250, 110 may exhibit a part spherical shaped reflective surface is due to thermal deformation of the reflective elements 250, 100 resulting from heating of the reflective elements 250, 110 by the beam of radiation 205.

It can be seen in FIG. 8 that divergence of the beam of radiation 205, causes the focus position 116 of the beam of radiation 205 when it is converged by the reflective element 112 to move in a direction parallel to the optical axis 405, away from the reflective element 112. The location of the focus position 116 perpendicular to the optical axis 405 is substantially unchanged. However, it can be seen that due to the divergence caused by the reflective elements 250, 110, the third amount of radiation 404 also follows a diverging path such that it is no longer incident on the first sensor arrangement 122.

In other words, the divergence of the beam of radiation 205 caused by the reflective elements 250, 110 also causes the path of the third amount of radiation 404 to move in a diverging direction (i.e. away from an optical axis 405 of the first amount of radiation 205). This movement of the path of the third amount of radiation 404 in a diverging direction will cause the position at which the third amount of radiation 404 is incident on the first sensor arrangement 122 (and hence the position measured by the first sensor arrangement) to move. In the case shown in FIG. 8 this movement will be in an upwards direction.

Although the position of the third amount of radiation 404 which is incident on the first sensor arrangement and measured by the first sensor arrangement is moved by the divergence of the reflective elements 250, 110, the focus position 116 of the beam of radiation 205 is unchanged perpendicular to the optical axis 405 when the beam of radiation 205 is converged by the reflective element 112. This is problematic due to the fact that the first sensor arrangement 122 measures a change in incident position (i.e. position at which the third amount of radiation is incident on the sensor arrangement) of the third amount of radiation 404 (which is indicative of a change in position perpendicular to the optical axis 405 of the focus position 116), but, in fact, the focus position 116 has not moved perpendicular to the optical axis 405. Consequently, spherical deformation of the reflective elements 250, 110 causes a movement in the focus position 116 perpendicular to the optical axis 405 to be erroneously measured by the first sensor arrangement 122 and therefore results in an inaccuracy in the focus position 116 measured by the first sensor arrangement 122.

Figure 9:
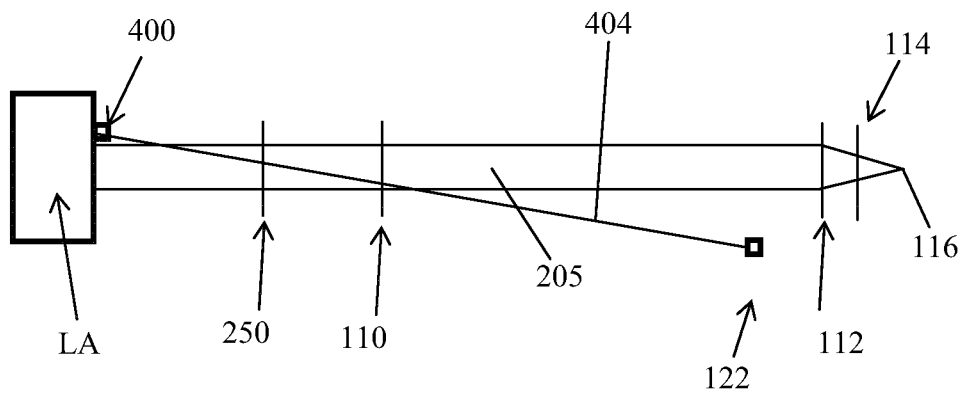
FIG. 9 shows a schematic diagram of an alternative arrangement for determining the location of a focus position to that shown in FIGS. 7 and 8.
Figure 10:
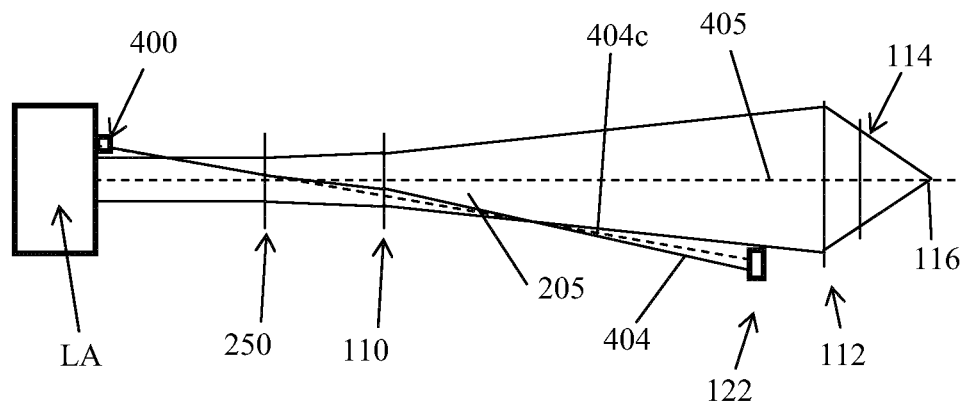
FIG. 10 shows a schematic diagram of the arrangement shown in FIG. 9 in a diverging beam condition.

FIGS. 9 and 10 show an arrangement which obviates or mitigates at least one of the problems described above. In this arrangement the alignment radiation source 400 is configured such that the third amount of radiation 404 travels in a direction which crosses (or traverses) the beam of radiation 205.

As will be explained below, because the third amount of radiation 404 crosses the beam of radiation 205 as opposed to travelling adjacent to it, this arrangement may have several beneficial characteristics.

The third amount of radiation 404 is incident on the reflective elements 250 and 110 at locations which are within the path of the beam of radiation 205. That is to say, the third amount of radiation 404 is incident on at least one radiation directing element (in this case the two reflective elements 250, 110) such that at least a portion of the third amount of radiation 404 which is incident on the at least one radiation directing element overlaps with at least a portion of the first amount of radiation (i.e., beam of radiation 205) which is incident on the at least one radiation directing element. This may be advantageous for several reasons.

First, due to the fact that the third amount of radiation 404 and the beam of radiation 205 overlap on the reflective elements 250 (as opposed to being adjacent to one another on the reflective elements 250, 150) the reflective elements 250, 110 can be of a reduced size (compared to those shown in the embodiment of FIG. 7). This is because the reflective elements 250, 110 need only be of a sufficient size to reflect/direct the beam of radiation 205 and do not need to be any larger in order to accommodate the path of the third amount of radiation 404.

Secondly, due to the fact that the third amount of radiation 404 and beam of radiation 205 overlap on the reflective elements 250, 110, the portions of the reflective elements 250, 110 which reflect/direct the third amount of radiation 404 are the same as the portions of the reflective elements 250, 110 which reflect/direct at least a portion of the beam of radiation 205. This may lead to a more accurate measurement of the focus position 116 of the beam of radiation 205. This is because the path of the third amount of radiation 404 is affected by a portion of each of the reflective elements 250, 110 which has a portion of the beam of radiation 205 incident on it. This is as compared to the embodiment shown in FIG. 7 in which the path of the third amount of radiation 404 is affected by a portion of each of the reflective elements 250, 110 which is not incident upon by the beam of radiation 205 and hence which does not directly affect the path of the beam of radiation 205. This may be of particular benefit in a situation where portions of the reflective elements 250, 110 upon which the beam of radiation 205 is incident have different characteristics to those portions of the reflective elements 250, 110 upon which the beam of radiation 205 is not incident. For example, in some situations, the portions of the reflective elements 250, 110 upon which the beam of radiation 205 is incident may absorb some of the radiation such that the beam of radiation heats these portions of the reflective elements. This may lead to thermally induced deformation of the reflective elements 250, 110 at the portions of the reflective elements upon which the beam of radiation 205 is incident. Such thermally induced deformation may be a generally spherically deformation of the reflective elements.

FIG. 10 shows the arrangement of FIG. 9 in a situation in which the beam of radiation 205 is caused to diverge by the reflective elements 250, 110. As previously discussed, this divergence may, in some embodiments, be due to generally spherically deformation of the reflective elements 250, 110 due to thermal effects resulting from the beam of radiation 205 being incident on the reflective elements 250, 110.

Dashed line 404c shows the path of the third amount of radiation if the reflective elements 250, 110 are un-deformed such that the beam of radiation 205 remains a parallel beam. The solid line 404 shows the path of the third amount of radiation in the case where the reflective elements 250, 110 are deformed such that the beam of radiation 205 diverges.

It can be seen that at the first reflective element 250 the deformed nature of the reflective element 250 causes the third amount of radiation 404 to deviate from the path 404c (i.e., the path without any deformation of the reflective elements, and hence without any divergence of the beam of radiation 205) in a direction which is generally upward with respect to the orientation or the Figure. The reason the third amount of radiation deviates upward is because the third amount of radiation 404 is incident on the reflective element 250 at a location that is above (with respect to the orientation of the Figure) the optical axis 405 of the radiation beam 205.

When the third amount of radiation 404 is incident on the reflective element 110 it is reflected in a direction that is downwards (having regard to the orientation of the Figure) with respect to the direction 404c of the third amount of radiation if the reflective element 110 was un-deformed. The reason the third amount of radiation deviates downwards is because the third amount of radiation 404 is incident on the reflective element 110 at a position which is below (having respect to the orientation of the Figure) the optical axis 405 of the beam of radiation 205.

It can be seen that the combination of the third amount of radiation 404 being reflected in generally opposite directions (i.e., upward at reflective element 250 and downward at reflective element 110) by each of the deformed reflectors 250, 110, results in a reduction of the deviation of the third amount of radiation (compared to the path of the third amount of radiation when the reflective elements 250, 110 are un-deformed) which is reflected by deformed reflective elements 250, 110 from the path taken by the third amount of radiation when the reflective elements 250 and 110 are not deformed. This can be seen clearly by comparing the amount of deviation of the third amount of radiation due to deformation of the reflective elements shown in FIG. 10 compared to the amount of deviation shown in FIG. 8.

It will be appreciated that the embodiment of the invention shown in FIGS. 9 and 10 does not totally eliminate movement in the position of the third amount of radiation 404 sensed by the first sensor arrangement 122 (due to deformation of the reflective elements 250, 110), but rather it minimizes the effect of the deformation of the reflective elements 250, 110 on the measured position of the third amount of radiation. Consequently, compared to that provided by the embodiment shown in FIGS. 7 and 8, the embodiment shown in FIGS. 9 and 10 will be able to more accurately determine the focus position 116 of the first amount of radiation 205 when the reflective elements which define the path of the first amount of radiation experience deformation.

The embodiment shown in FIGS. 9 and 10 may also be advantageous in certain applications because, due to the fact that the third amount of radiation traverses the radiation beam 205 (or put another way, the third amount of radiation 404 is non-parallel to the beam of radiation 205), the first sensor arrangement 122 may be spaced some distance from the beam path of the beam of radiation 205. This means that there may be less constraint on the sizing and positioning of the first sensor arrangement 122. Consequently, in this arrangement, the first sensor arrangement 122 may be easier to produce and/or locate compared to that shown in FIGS. 7 and 8.

Figure 11:
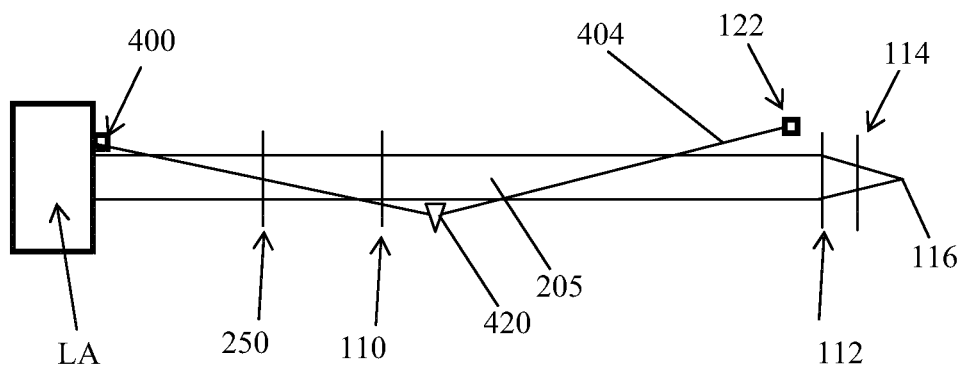
FIG. 11 shows a schematic diagram of a further alternative arrangement for determining the location of a focus position.

FIG. 11 shows a modification to the arrangement shown in FIGS. 9 and 10. In the arrangement shown in FIG. 11, after the third amount of radiation has been reflected by the reflective elements 250, 110 it is incident on a radiation directing element 420 which changes the direction of the third amount of radiation 404 and directs it so that it is incident on the first sensor arrangement 122. Any appropriate number and type of radiation directing element may be used so as to define the path of the third amount of radiation 404 before it is incident on the first sensor arrangement 122. In this case, the radiation directing element 420 is a refractive wedge. It will be appreciated that in other embodiments, once the direction of the third amount of radiation 404 has been changed by the radiation directing element 420 it may be incident on further reflective elements (which also direct the path of the first amount of radiation 205) before the third amount of radiation 404 is incident on the first sensor arrangement 122.

The use of the reflective element 420 enables a greater freedom in the desired path which is taken by the third amount of radiation 404 and consequently allows a greater freedom in the positioning of the first sensor arrangement 122.

Figure 12:
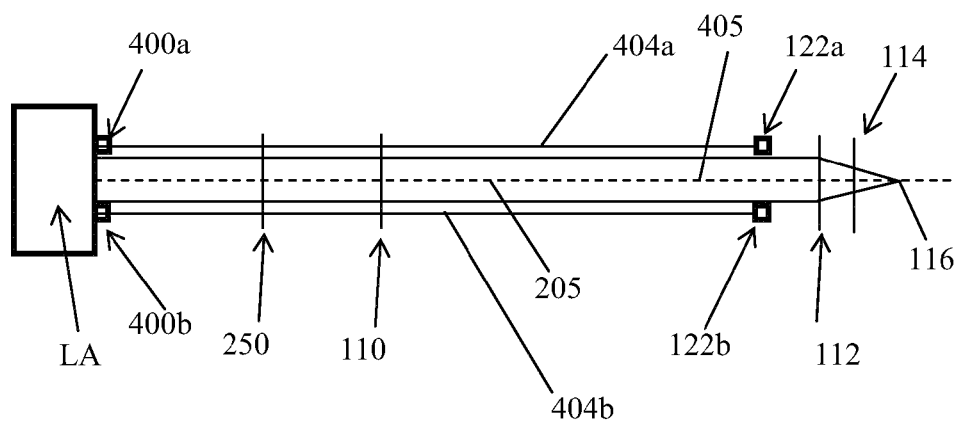
FIG. 12 shows a schematic diagram of another alternative arrangement for determining the location of a focus position.
Figure 13:
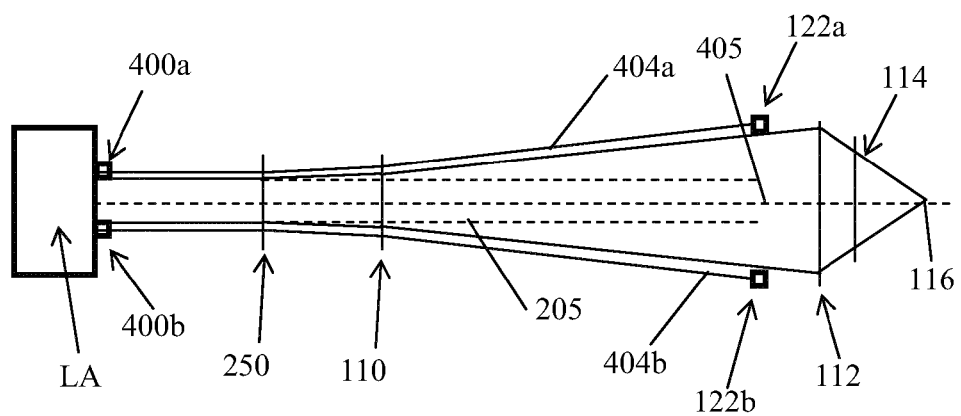
FIG. 13 shows a schematic diagram of the arrangement shown in FIG. 12 in a diverging beam condition.

FIGS. 12 and 13 show a further arrangement for measuring the location of the focus position of the first amount of radiation which includes first and second alignment radiation sources 400a, 400b. The first alignment radiation source 400a emits a third amount of radiation 404a which is incident on a first sensor 122a of the first sensor arrangement. The second alignment radiation source 400b produces a further amount of radiation 404b which is incident on a second sensor 122b of the first sensor arrangement. The remaining features of the embodiments shown in FIGS. 12 and 13 are equivalent to those shown in the preceding Figures and these features have been correspondingly numbered as appropriate.

The first sensor arrangement comprises the first sensor 122a which is configured to measure a property of the third amount of radiation, and a second sensor 122b which is configured to measure a property of the further amount of radiation 404b. The third and further amounts of radiation 404a, 404b are collectively indicative of the focus position 116 of the first amount of radiation 205.

In the embodiment shown in FIGS. 12 and 13, the first amount of radiation (beam of radiation 205) propagates along an optical axis 405. The first sensor 122a and second sensor 122b are angularly spaced from one another about the optical axis 405 by approximately 180°. It will be appreciated that in other embodiments the first and second sensors may have any appropriate angular spacing, FIG. 12 shows a situation in which the reflective elements 250, 110 are not deformed such that the beam of radiation 205 is substantially parallel. FIG. 13 shows a situation in which the reflective elements 250 and 110 are deformed such that the beam of radiation 205 is caused to diverge by the reflective elements 250, 110.

It can be seen from the FIGS. 12 and 13 that in the case where the beam of radiation 205 is diverging (FIG. 13), the positions at which the third and further amounts of radiation 404a, 404b are incident on the first and second sensors 122a, 122b will be a greater distance from the optical axis 405 compared to that when the beam of radiation 205 is parallel. As previously discussed, divergence of the beam of radiation 205 does not necessarily result in movement (perpendicular to the optical axis) of the focus position 116 of the first amount of radiation 205. This is shown by the fact that the focus position 116 of the beam of radiation 205 in FIG. 13 has moved in a direction which is parallel to the optical axis (i.e. to the right with respect to the orientation of the figures) compared to that in FIG. 12. The focus position 116 of the beam of radiation 205 in FIG. 13 has not moved in a direction which is perpendicular to the optical axis (i.e. up or down with respect to the orientation of the figures, or into or out of the plane of the figures) compared to that in FIG. 12.

The use of first and second sensors 122a and 122b which are used to detect a property (in this case the incident position) of the third and further amounts of radiation 404a, 404b means that divergence of the first amount of radiation 205 can be measured and/or compensated for. If desired, this can be done simultaneously when determining the focus position 116 of the beam of radiation 205, however in some embodiments the divergence of the first amount of radiation 205 can be measured and/or compensated for without determining the focus position 116 of the beam of radiation 205. The divergence of the first amount of radiation 205 can be measured as follows.

The first sensor 122a measures the position at which the third amount of radiation is incident upon it. Likewise, the second sensor 122b measures the position at which the further amount of radiation 404b is incident upon it. The first sensor arrangement (which comprises the first sensor 122a and the second sensor 122b) can therefore measure the distance between the position at which the third amount of radiation is incident on the first sensor and the position at which the further amount of radiation is incident on the second sensor. This distance will be indicative of the divergence of the first amount of radiation 205. A previously discussed, the divergence of the first amount of radiation 205 may be caused by deformation of reflective elements 250, 110. This measurement of divergence may be provided to the controller of the radiation source. The controller of the radiation source may then provide a control signal to at least one controlled optical element of the radiation source so as to control the optical element in order to achieve a desired divergence of the first amount of radiation 205.

In an alternative arrangement, based on the measurement of divergence provided to the controller, the controller of the radiation source may then provide a control signal to at least one controlled optical element of the radiation source so as to control the optical element in order to control the distance travelled by the first amount of radiation between the focusing reflective element 112 and the plasma formation location 212. In the radiation sources shown in FIGS. 4 to 6, this may be done by controlling the position/orientation of the moving reflective element 114. It will be appreciated that in other embodiment, any appropriate optical element may be controlled by the controller to control the distance travelled by the first amount of radiation between the focusing reflective element 112 and the plasma formation location 212. In a further alternative embodiment, based on the measurement of divergence provided to the controller, the controller of the radiation source may then provide a control signal which controls the position/orientation of the nozzle 128 so as to control the trajectory of the fuel droplets so that they travel to the focus position of the first amount of radiation (also referred to as the plasma formation location 212).

When the arrangement shown in FIGS. 12 and 13 is used to determine the focus position 116 of the first amount of radiation 205 the location measured by the first sensor 122a and the location measured by the second sensor 122b may be averaged so as to provide an indication of the focus position 116 of the first amount of radiation 205. For example, if the beam of radiation 205 diverges then the position measured by the first sensor 122a will move upward (with respect to the orientation of the Figure) and the position measured by the second sensor 122b will move downward (with respect to the orientation of the Figure). If the measurement made by the first sensor 122a and the measurement made by the second sensor 122b are averaged in the vertical direction (with respect to the orientation of the Figure) then, because, due to divergence of the paths of the third and further amounts of radiation, the position measured by the first sensor 122a moves upward by substantially the same amount that the position measured by the second sensor 122b moves downward, the average of the two measured positions will remain substantially constant. Hence, divergence of the paths of the third and further amounts of radiation due to deformation of the reflective elements will not result in the first sensor arrangement measuring a change of location of the focus position of the first amount of radiation.

This is in contrast to the situation whereby, for the sake of argument, the direction of the first amount of radiation 205 moves upward (given the orientation of the Figure). In this situation, the position of the third and further amounts of radiation measured by both the first sensor 122a and the second sensor 122b will move upward (with respect to the orientation of the Figure). Consequently, in this situation, the output of the first sensor arrangement (which comprises the first sensor and the second sensor), which is averaged in the vertical direction (with respect to the orientation of the Figure), will move upward, correctly indicating that the location of the focus position of the first amount of radiation 205 has moved upward.

Figure 14:
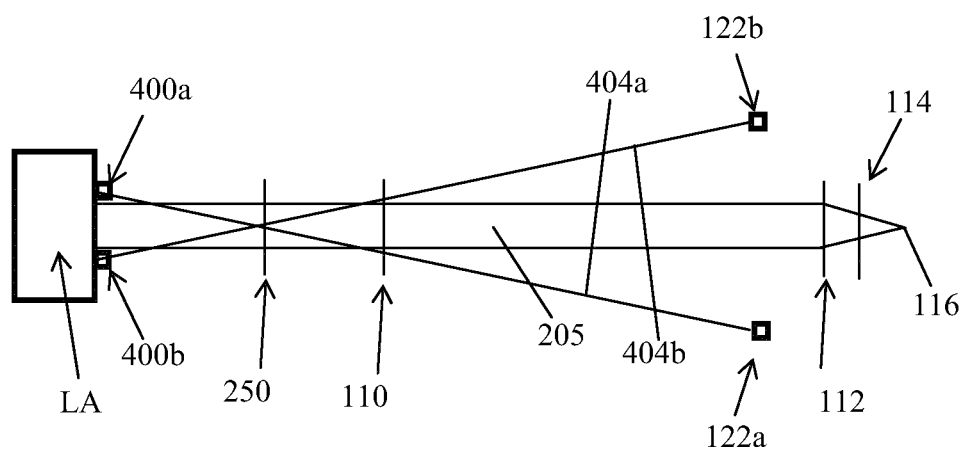
FIG. 14 shows a schematic diagram of a further alternative arrangement for determining the location of a focus position.
Figure 15:
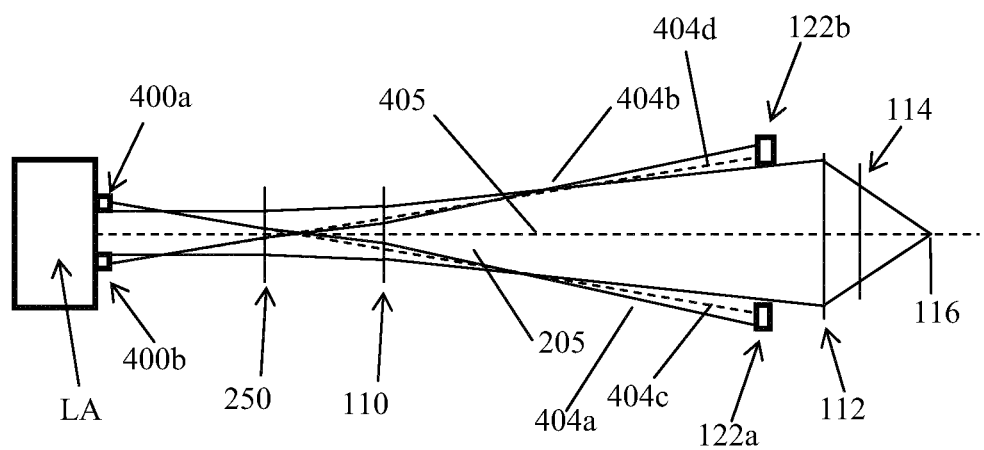
FIG. 15 shows a schematic diagram of the arrangement shown in FIG. 14 in a diverging beam condition.

FIGS. 14 and 15 show an alternative arrangement for measuring the focus position 116 of the first amount of radiation (radiation beam 205). This arrangement combines the features of the arrangement shown in FIGS. 12 and 13 with the arrangement shown in FIGS. 9 and 10. Equivalent features within FIGS. 14 and 15 to those shown in FIGS. 12 and 13 have been given the same numbering.

The arrangement comprises first and second alignment radiation sources 400a, 400b. The first alignment radiation source 400a emits the third amount of radiation 404a, and the second alignment radiation source 400b emits a further amount of radiation 404b. This arrangement differs from that shown in FIGS. 12 and 13 (and is similar to that shown in FIGS. 9 and 10) in that each of the third amount of radiation 404a and further amount of radiation 404b travel such that they cross the first amount of radiation 205 as opposed to running parallel to the first amount of radiation 205. That is to say, each of the third amount of radiation 404a and further amount of radiation 404b are non-parallel to the first amount of radiation 205.

The alignment radiation sources 400a, 400b, third amount of radiation 404a and further amount of radiation 404b, and first and second sensors 122a, 122b are symmetric about the optical axis 405 of the first amount of radiation 205. In other embodiments, this need not be the case.

Each of the third amount of radiation 404a and further amount of radiation 404b travel between their respective alignment radiation source and respective sensor such that they are angled to the optical axis 405 and such that they traverse the optical axis 405. As previously discussed with reference to FIG. 10, the path of each of the third amount of radiation 400a and further amount of radiation 400b such that they traverse the first amount of radiation 205 helps to reduce the effect of divergence, for example caused by deformation of the reflective elements 250, 110. Dashed lines 404c and 404d within FIG. 15 indicate the path of the third amount of radiation and further amount of radiation respectively in the situation where there is no divergence of the beam of radiation 205 caused by deformation of the reflective elements (as shown in FIG. 14).

Within the arrangement shown in FIGS. 14 and 15 the third amount of radiation 404a and the further amount of radiation 404b are incident on the radiation directing elements (reflective elements 250, 110) such that at least a portion of the third amount of radiation 404a and at least a portion of the further amount of radiation 404b which is incident on the at least one radiation directing element (reflective elements 250, 110) overlap with at least a portion of the first amount of radiation 205 which is incident on the at least one radiation directing element (reflective elements 250, 110).

Figure 16:
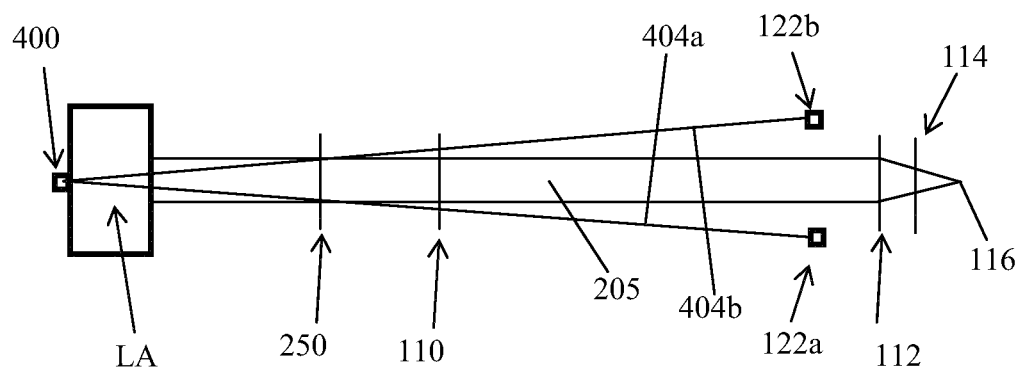
FIG. 16 shows a schematic diagram of a yet another alternative arrangement for determining the location of a focus position.

FIG. 16 shows another arrangement suitable for determining the location of the focus position 116 of the first amount of radiation (beam of radiation 205). In this embodiment the alignment radiation source 400 is located such that third and further amounts of radiation 404a and 404b produced by the alignment radiation source 400 pass through the secondary radiation source LA before being reflected by reflective elements 250, 110 such that they are incident on their respective first and second sensors 122a, 122b.

In particular, the secondary radiation source LA may include various optical components for directing and/or amplifying radiation within the secondary radiation source so as to produce the first amount of radiation (beam of radiation 205). For example, the secondary radiation source LA may include an amplifier tube containing a lasing medium through which radiation passes and is amplified. The amplifier tube may also include a number of reflectors such that the radiation passes through the amplifier tube undertakes a tortuous path to thereby increase the amount of interaction between the radiation passing through the amplifier tube and the lasing medium within the amplifier tube.

In one arrangement, the alignment radiation source 400 may be positioned such that the third amount of radiation 404a and further amount of radiation 404b pass through the amplifier tube and/or any other appropriate optical component within the secondary radiation source LA before being incident on the first sensor arrangement.

By directing the third amount of radiation 404a and further amount of radiation 404b through the amplifier tube and/or any other appropriate optical component within the secondary radiation source LA, the path of the third amount of radiation 404a and further amount of radiation 404b will be affected by the relative alignment of the amplifier tube and/or other optical component within the secondary radiation source LA. Consequently, measuring a property (for example incident position) of the third amount of radiation 404a and further amount of radiation 404b may provide an indication as to the effect of the relative alignment of the amplifier tube and/or other optical component within the secondary radiation source LA on the location of the focus position of the first amount of radiation. It follows, that this information may be used to correct the relative alignment of the amplifier tube and/or other optical component so as to achieve a desired location of the focus position of the first amount of radiation. Furthermore, in some embodiments, the controller of the radiation source may be configured to, based on the measured property of the third amount of radiation, control the position, orientation and/or other appropriate property of a reflective element (for example reflective elements 250, 114) so as to compensate for or mitigate at least one property of the secondary radiation source which has an adverse affect on the performance of the radiation source. For example, the controller may move at least one of the reflective elements 250, 114 so as to compensate for or mitigate misalignment between the amplifier tube and other optical components within the secondary radiation source.

It can be seen that, within the embodiment shown in FIG. 16, the alignment radiation source 400 produces both third and further amounts of radiation 404a and 404b. In other embodiments, separate alignment radiation sources may be used to produce the third and further amounts of radiation. In further embodiments, the alignment radiation source 400 may only be the only alignment radiation source and it may only produce a third amount of radiation such that there is only a single alignment amount of radiation (e.g. third amount of radiation) which passes through the secondary radiation source.

Within all of the previously described arrangements for determining the location of the focus position of the first amount of radiation 205, various changes may be made. For example, in any arrangement in which there are more than one alignment radiation source, then, instead of using a separate alignment radiation source to produce each amount of alignment radiation, in other arrangements a single alignment radiation source may be used to produce a plurality of amounts of radiation (for example both third and further amounts of radiation). For example a beam-splitter may be used to split a single beam of radiation produced by an alignment radiation source into multiple beams (amounts of radiation).

Furthermore, in any of the previously described arrangements which have a first sensor arrangement that comprises a plurality of sensors in order to detect a property (in this case incident position) of amounts of radiation, in other arrangements, the multiple amounts of radiation (for example third and further amounts of radiation) may be directed such that they are incident on the same sensor. For example, the multiple amounts (e.g. third and further amounts) of radiation may be directed by optical components so that they are incident on a sensor at substantially the same position. In this instance, the multiple amounts (e.g. third and further amounts) of radiation may be incident on the sensor simultaneously, or the multiple amounts of radiation may be incident on the sensor in a time multiplexed manner. In such an embodiment, the alignment radiation source(s) may be time modulated.

In another arrangement, multiple alignment amounts of radiation may be incident at substantially different locations on a single sensor. For example, in some arrangements a single sensor which is generally annular may be used, the sensor being located such that the first amount of radiation 205 passes through the centre of the annulus and such that the multiple alignment amounts of radiation (e.g. third and further amounts of radiation) are incident on the sensor at positions which are spaced around the annulus from one another.

In relation to the arrangements shown in FIGS. 12 to 16, an example of averaging the output of the first and second sensors has been described so as to determine the location of the focus position. It will be appreciated that any appropriate averaging of the output of the first and second sensors may be used so as to determine the location of the focus position of the first amount of radiation. In fact, any appropriate collective use of the output of the first and second sensors may be used to determine the location of the focus position of the first amount of radiation.

Although the described arrangements for determining the location of the focus position of the first amount of radiation which have been described have either a single beam of alignment radiation (for example the third amount of radiation) or have two alignment radiation beams (for example the third amount of radiation and further amount of radiation), in other arrangements any appropriate number of alignment radiation beams (and hence alignment radiation sources and sensors) may be used.

The arrangements described above for determining the location of the focus position of the first amount of radiation have the benefit that, in some applications, they may be operated at a time when the first amount of radiation is not being produced by the secondary radiation source LA.

It will be appreciated that within some of the embodiments discussed above a controller, based on sensor signals provided to it, controls at least one optical element to control the focus position of the first amount of radiation. In addition or in the alternative, it will be appreciated that the controller may also control at least one optical element to control the direction of the first amount of radiation when it reaches the focus position (also referred to as the orientation of the focus), and hence the direction at which the first amount of radiation is incident on the fuel. In some applications, this may be of particular importance. For example, when the first amount of radiation is a pre pulse, the orientation of the focus may determine the spatial distribution of the modified fuel distribution and thereby the angular distribution of the generated second amount of radiation. Consequently, the radiation source may control the orientation of the focus so as to control the angular distribution of the second amount of radiation.

Figure 17:
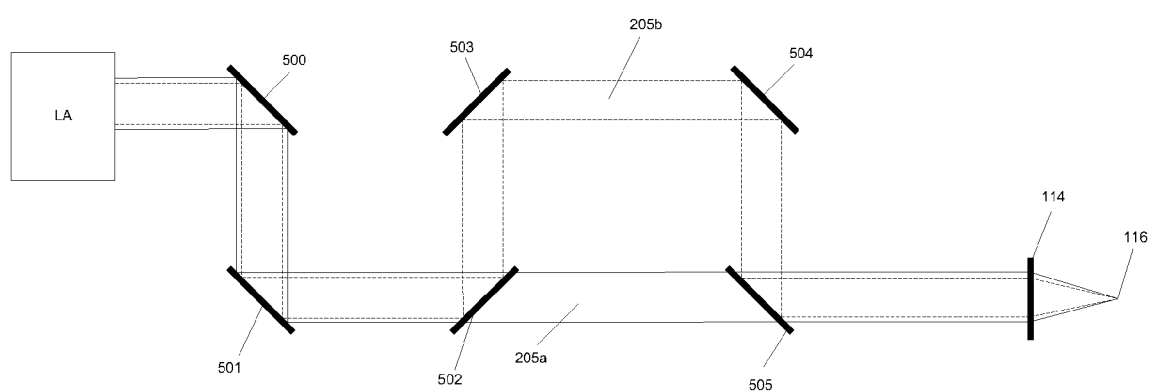
FIG. 17 shows a schematic diagram of an alternative arrangement for directing two beams towards a focus position.

As is discussed above, the first amount of radiation may be either, or both, a pre-pulse or a main-pulse. That is, both the relative alignment between the focus of the pre-pulse and the fuel, and the relative alignment between the focus of the main-pulse and the modified fuel distribution may be important, and may be controlled independently. The controller may therefore receive two sets of sensor information; a first set relating to the pre-pulse and a second set relating to the main-pulse. The controller may therefore control reflector actuators to alter the focus position of the pre-pulse and the main-pulse. In order to improve independent control of the pre-pulse and main-pulse, in some embodiments of the present invention, the radiation source SO is configured to provide different actuated reflectors to direct the pre-pulse than the actuated reflectors that direct the main pulse. For example, FIG. 17 schematically illustrates a portion of the radiation source SO according to one embodiment of the invention. FIG. 17 illustrates the beam path of a pre-pulse 205a and a main-pulse 205b from the secondary radiation source (in this case the laser LA) to the focus position 116.

In the embodiment shown in FIG. 17, the pre-pulse is incident on directing reflector elements 500, 501 which act to direct the pre-pulse 205a to the reflector element 114. The reflector element 114 acts to direct and focus the pre-pulse 205a toward the focus position 116. Either or both of the reflector elements 500, 501 may be connected to actuators (not shown in FIG. 17) to allow modifications to be made to the position and/or orientation of the reflector elements 500, 501. The main-pulse 205b is also incident on the reflector elements 500, 501 such that for a first part of its trajectory, the path main-pulse 205b is substantially coincident with the path of the pre-pulse 205a. The main-pulse 205b is, however additionally incident on an reflector element 502. The reflector element 502 is configured to direct the main-pulse 205b away from the path of the pre-pulse 205a towards further reflector elements 503, 504. As such, for a second part of its trajectory, the path of the main-pulse 205b is not coincident with the path of the pre-pulse 205a. The reflector element 502 may, for example, be adapted to reflect only radiation having a wavelength corresponding to that of the main-pulse 205b, while allowing radiation having a wavelength corresponding to that of the pre-pulse 205a to pass through the reflector element 502. For example, in an embodiment in which the pre-pulse has a wavelength of 10.3 μm and the main-pulse has a wavelength of 10.6 μm, the reflector element 502 may be adapted to reflect radiation having a wavelength of 10.6 μm while being substantially or completely transparent to radiation having a wavelength of 10.3 μm.

The reflector element 504 is adapted to direct the main-pulse 205b towards a reflector element 505, the reflector element 505 being adapted to direct the main-pulse 205b towards the reflector element 114. Similarly, the reflector element 505 may be a reflector adapted to reflect only radiation having a wavelength corresponding to that of the main-pulse 205b while allowing radiation having a wavelength corresponding to that of the pre-pulse 205a to pass through the reflector element 505. The reflector element 114 is adapted to direct and focus the main-pulse 205b toward the focus position 116. The reflector elements 503, 504 may be connected to actuators (not shown in FIG. 17) to allow the controller to make modifications to the position and/or orientation of the reflector elements 503, 504.

The separation of the path of the main-pulse 205b from the path of the pre-pulse 205a provides the ability to direct the main-pulse 205b without using the actuated reflector elements used to direct the pre-pulse 205a. As such, the arrangement of FIG. 17 advantageously avoids the need for rapid, periodic, adjustments to the position and/or orientation of reflector elements 500, 501. That is, where adjustments to the focus position of both the main-pulse 205b and the pre-pulse 205a are required (due, for example, to a distance travelled by the fuel droplet between the emission of the pre-pulse 205a and the main-pulse 205b), the controller need not adjust the position and/or orientation of reflector element 500 and/or 501 to direct both the pre-pulse 205a in one instant and the main-pulse 205b shortly after. Indeed, given the generally short temporal offset between the pre-pulse and the main-pulse, actuation of a single mirror to direct both the pre-pulse 205a and the main-pulse 205b requires actuators capable of making very quick adjustments. In the embodiment of FIG. 17, however, the controller can direct the pre-pulse 205a through adjustments to the position and/or orientation of the reflector element 500 and/or 501, and direct the main-pulse 205b through adjustments to the position and/or orientation of the reflector element 503 and/or 504. The embodiment of FIG. 17 therefore allows the use of cheaper, less complicated actuators.

Although the embodiment of FIG. 17 has been described with reference to a particular configuration of reflector elements, it will be appreciated that any other configuration of reflector elements may be provided to provide independent control of the pre-pulse 205a and the main-pulse 205b. Furthermore, in other embodiments of the invention, any appropriate directing and focusing element(s) (i.e., other than reflector elements) may be used to direct and focus the first amount of radiation (both pre-pulse and main-pulse) towards a focus position.

Further, while the embodiment of FIG. 17 is described with reference to reflector elements in the radiation source SO external to the laser LA, in alternative embodiments of the invention the laser LA may itself be configured to provide independent adjustment of the pre-pulse 205a and the main-pulse 205b. For example, the laser LA may comprise means to selectively alter a path taken through the laser LA, or to selectively utilize one or more optical elements (such as reflectors) to alter a path, taken by each of the pre-pulse 205a and the main-pulse 205b through the laser LA. In this way, a focus position of the pre-pulse 205a and the main-pulse 205b may be independently selected. In another alternative embodiment, different lasers may provide the pre-pulse and the main-pulse, each laser being capable of independent direction towards respective focusing positions.

In the embodiments discussed above, one or more actuators are mechanically linked to one or more reflector elements. The actuators are controlled to change an orientation or position of the one or more reflector elements to control a focus position of the first amount of radiation. In particular, with reference to the embodiments described in FIG. 3, reflector actuators 118, 120 are mechanically connected to reflector 114 and movement of at least one of the reflector actuators 118, 120 changes the orientation and/or position of the reflector 114 relative to the path of the beam of radiation 205 so as to alter the focus position 116 of the beam of radiation 205. Additionally, in embodiments described with reference to, for example, FIG. 4, reflector actuators 255 are mechanically connected to the second moveable reflector 250 so that movement of the reflector actuators 255 adjusts the orientation and/or position of the second movable reflector element relative to the radiation beam 205 so as to alter the focus position 116 of the beam of radiation 205.

As has been discussed above, movement of the actuators may be controlled by a radiation source controller, which is configured to receive signals output by one or more sensors such as the first sensor arrangement 122 and/or the second sensor arrangement 134 (FIGS. 3 to 6). The controller may be configured to control the relative alignment between the fuel droplet and the focus position of the first amount of radiation by providing control signals to the reflector actuators. It has, however, been unexpectedly realized that movement of the actuators of the radiation source SO may itself result in disruption in the relative alignment between the focus position and the first amount of radiation. In particular, movement of the actuators of the radiation source SO may result in unintended and undesirable movement of other components within the radiation source SO. For example, intentional movement of the actuators 255 to adjust the orientation/position of the reflector may result in unintended movement of other optical elements (i.e. elements which interact with the first amount of radiation) of the radiation source SO such as other reflector elements or sensor arrangements (such as the sensor arrangements 122, 134). Unintentional movement of optical elements such as reflectors may result in misalignment between the fuel droplet and the focus position of the first amount (which may be either a pre-pulse or a main-pulse) of radiation. Unintentional movement of optical elements such as sensor elements may result in loss of accuracy in determining a relative alignment between the first amount of radiation and the position of the fuel droplet or modified fuel distribution.

Referring again to FIGS. 3 to 6, misalignment of the first amount of radiation and the fuel droplet (or modified fuel distribution), whether caused by operation of actuators, or other causes, may be detected by the first and/or second sensor arrangements 122, 134. Data concerning the detected misalignment is then provided to the radiation source controller, causing the radiation source controller to send control signals to one or more of the actuators of the radiation source SO to adjust those actuators. Further movement of the actuators of the radiation source SO may subsequently result in further unintentional movement of other optical elements of the radiation source SO. It will therefore be appreciated that adjustments of actuators to correct a misalignment which is itself caused by a previous adjustment to actuators may result in a detrimental feedback loop leading to control loop instability, and an inability of the radiation source controller to accurately control the alignment between the fuel droplet and the focus position of the first amount of radiation.

We can refer to the maximum frequency at which distinct adjustments can be made to the reflector element 250 (or any other reflector element) as the bandwidth limiting frequency. Given the discussion above, it will be appreciated that if the reflector element 250 is undergoing adjustments at the bandwidth limiting frequency, further adjustments cannot be made.

Figure 18:
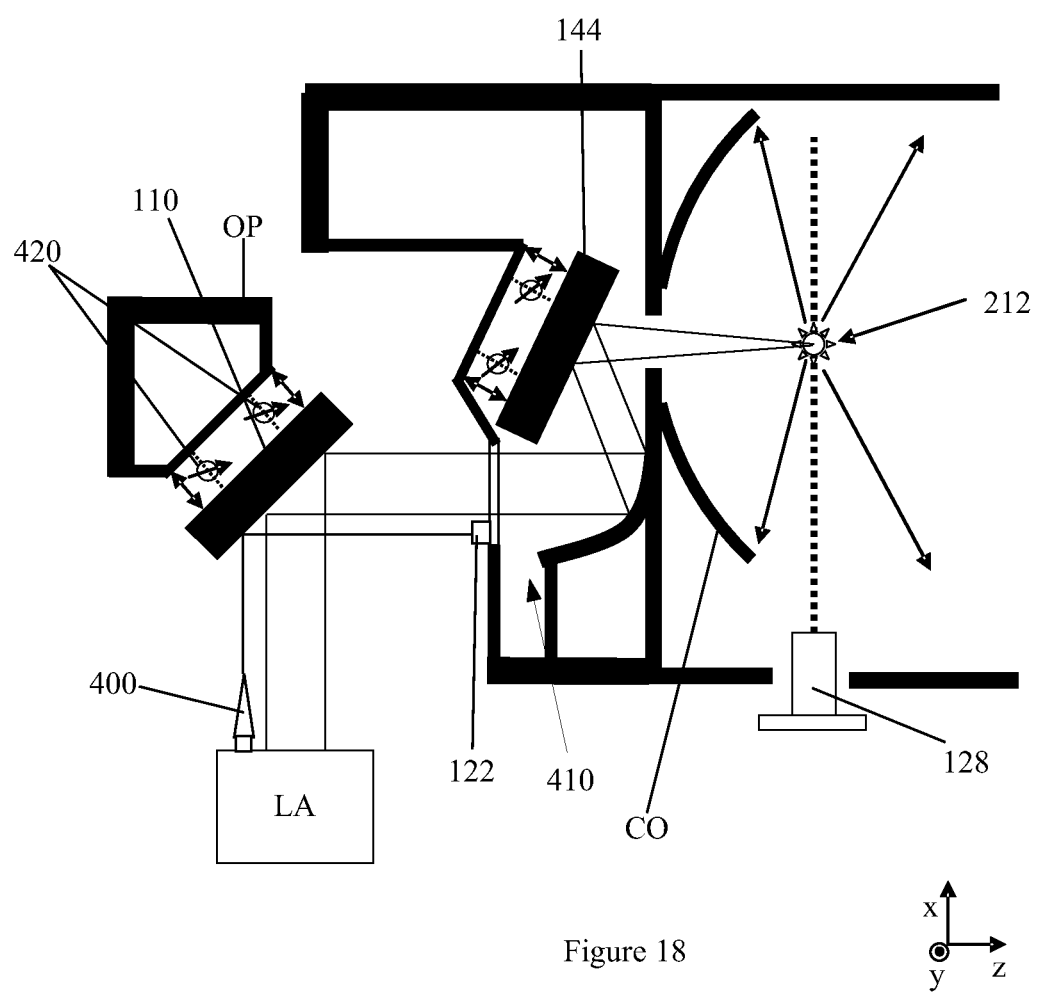
FIG. 18 shows a schematic diagram of an alternative arrangement for vibrationally isolating some components of the radiation source from other components of the radiation source.

In some embodiments of the present invention, some optical elements of the radiation source SO are mechanically separated from other optical elements of the radiation source SO, as illustrated in FIG. 18. Features of the radiation source shown in FIG. 18 that are equivalent to those of the radiation source shown in previous Figures have been given the same numbering.

In the embodiment of the invention shown in FIG. 18, optical elements (of which only the reflector 110 is shown) are mounted separately to the first chamber 410 on an optics platform OP. As in the embodiments illustrated in the embodiments of FIGS. 3 to 6, the reflector element 114 is mounted within the first chamber 410. The reflector element 110 is mechanically connected to reflector actuators 420, and the radiation source controller (not shown) is configured to provide control signals to the reflector actuators 420 to adjust the position and/or orientation of the reflector 110 in order to control the relative alignment between the fuel droplet and the focus position of the first amount of radiation. As can be seen in FIG. 18, the optics platform OP is not mechanically connected to the first chamber 410 other than through the pedestal 421. By mounting the reflector element 110 separately from first chamber 410, the effect of adjustments made to the position and/or orientation of one of the reflector elements 110, 114 on the other of the reflector elements 110, 114 is reduced.

Figure 19:
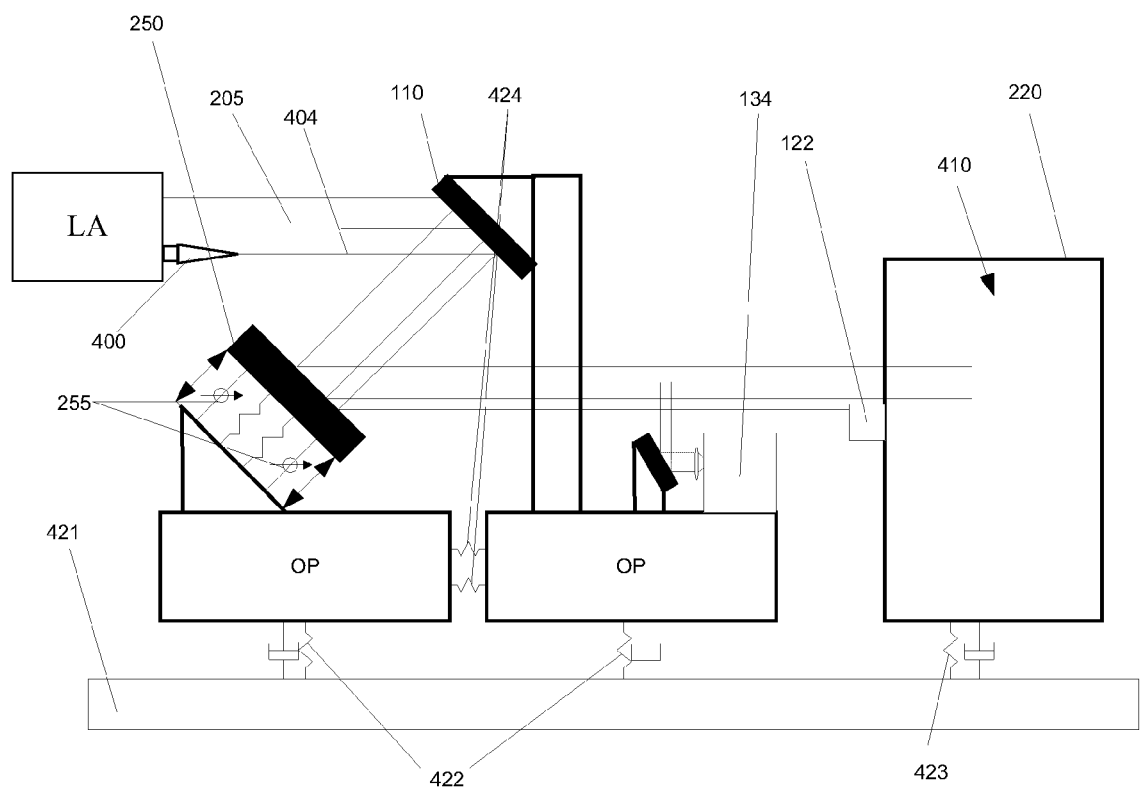
FIGS. 19 to 21 show schematic diagrams of further alternative arrangements for vibrationally isolating some components of the radiation source from other components of the radiation source.

While only a single optical element (the reflector 420) is shown in FIG. 18, the optics platform OP may provide a mounting for a plurality of optical elements. FIG. 19 schematically illustrates components which may be mounted on the optics platform OP. In the embodiment illustrated in FIG. 19, the optics platform OP and the first chamber 410, are shown mounted on a pedestal 421. The pedestal 421 may be mounted (directly or indirectly) on the floor of a building in which the radiation source SO is housed. In some embodiments, the optics platform OP and the first chamber 410 may be mounted directly on a floor of the building in which the radiation source SO is housed.

The optics platform OP is mounted to the pedestal 421 by way of damping elements 422, and the first chamber 410 is mounted to the pedestal 421 by damping elements 423. The damping elements 422, 423 may be any appropriate damping elements such as a spring-mass-damping system. The optics platform OP is not entirely rigid, as illustrated by flexible members 424. The reflector element 250, the actuators 255, the reflector element 110, the second sensor arrangement 134 and the beam splitting apparatus (not shown in FIG. 19) are each mounted on the optics platform OP. Again, it will be appreciated that further optical elements than those shown in FIG. 19 may be mounted on the optics platform OP.

The force applied by the actuators 255 to make adjustments or corrections to the position and/or orientation of the reflector element 250 cause the optics platform OP to oscillate with a frequency determined by the frequency at which adjustments are made to the position and/or orientation of the reflector element 250. While the vibrations of the optics platform OP are mechanically separated from the components mounted within the first chamber 410, the oscillations of the reflector element 250 are coupled with the oscillations of the other components mounted atop the optics platform OP. That is, the optical elements mounted aboard the optics platform OP may act as coupled oscillators, such that oscillations of the reflector element 250 may result in undesirable and problematic oscillations of other optical elements mounted on the optics platform OP. Such oscillations may also result in disturbance of the beam path of the first amount of radiation, thereby creating difficulties in controlling the alignment between the focus position of the first amount of radiation and the position of the fuel droplet (or modified fuel distribution).

Figure 20:
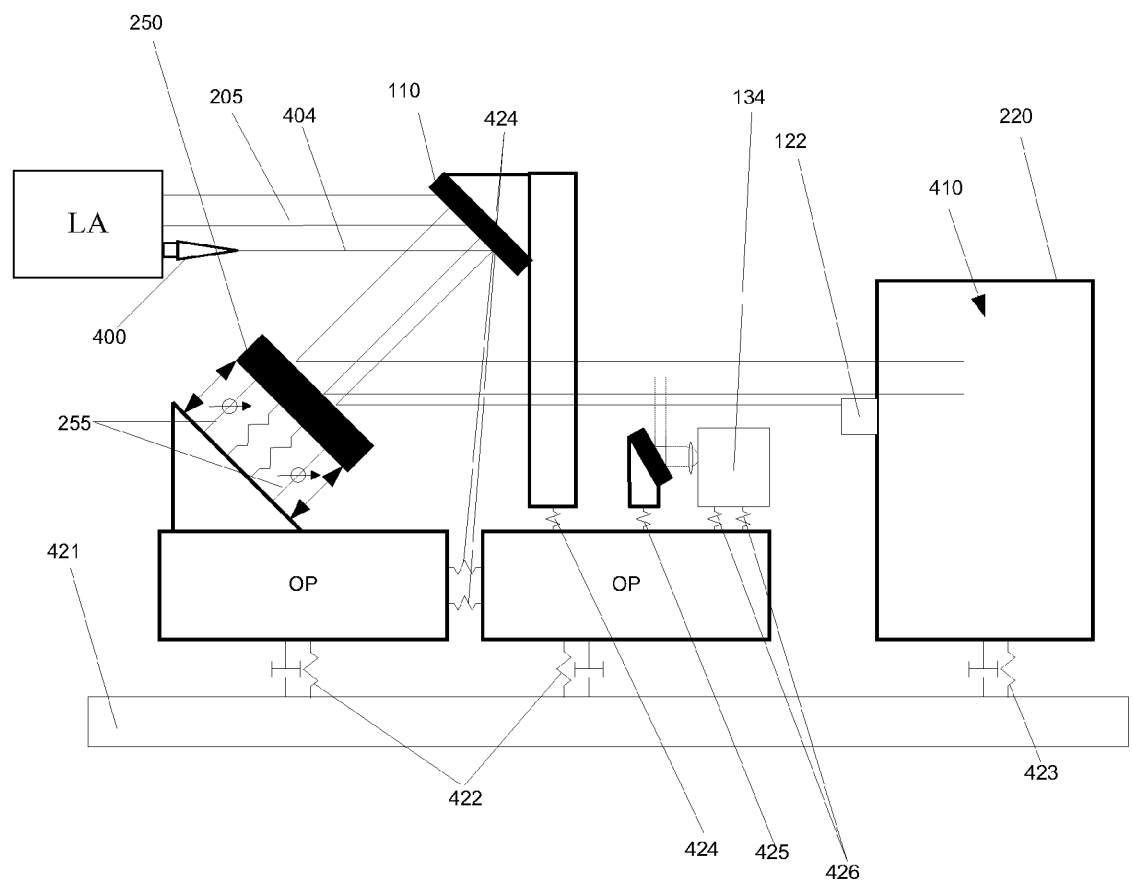

FIG. 20 illustrates a further embodiment of the present invention, which is a modification of the embodiment illustrated in FIG. 19. In the embodiment of FIG. 20, the effects of oscillations caused by the adjustment of the position and/or orientation of the reflector 250 are reduced. In particular, the reflector 110, second sensor arrangement 134 and the beam splitting apparatus (referred to collectively as 'passive optical components' because, in the embodiment of FIG. 20, these components are not actively actuated) are isolated from the optics platform OP by respective isolating elements 424, 425, 426. The isolating elements 424, 425, 426 may be selected so as to isolate the passive optical components of the optics platform at a frequency below a maximum frequency at which corrections can be made to the position and/or orientation of the reflector element 250 (i.e. a frequency below the bandwidth limiting frequency). In this way, adjustments made to the position and/or orientation of the reflector element 250 will not result in a detrimental feedback loop affecting the position of the other optical components mounted on the optics platform OP. That is, by isolating the passive optical components at a frequency below the bandwidth limiting frequency, there will be a greater bandwidth margin in which adjustments can be made to the reflector element 250 without coupled vibrations in the passive optical components causing further adjustments to be made to the reflector element 250 at the bandwidth limiting frequency, resulting in a detrimental feedback loop.

From the above, it will be appreciated that the actual frequency at which the passive components are isolated from the optics platform OP will depend upon a plurality of factors including the mass of the reflector element 250, the masses of each of the passive optical elements, the force with which the actuators 255 act upon the optics platform OP and the maximum frequency at which adjustments are made to the position and/or orientation of the reflector element 250.

It will be appreciated that any appropriate isolating means may be used for isolating elements 424, 425, 426. For example, the isolating means 424, 425, 426 may be passive isolating means, such as a spring-mass-damper system, or may be dynamic isolating means.

Figure 21:
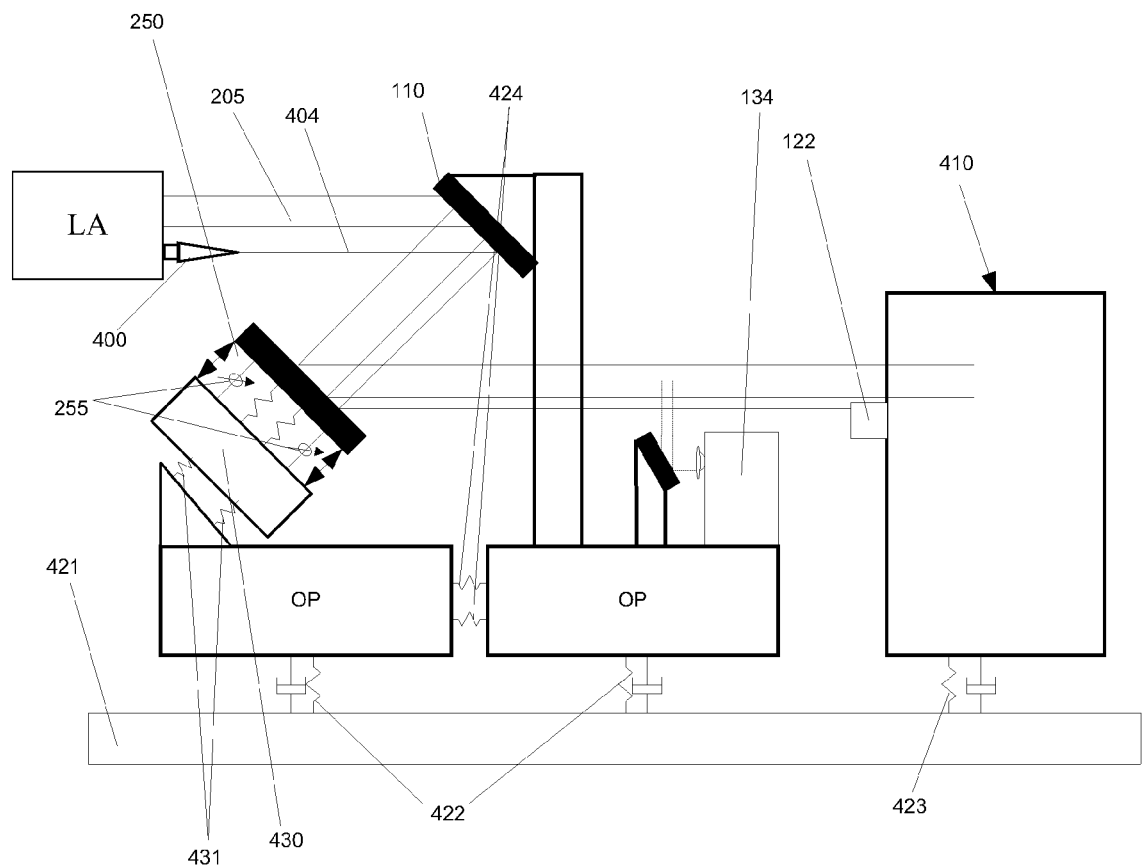

An alternative embodiment of the present invention is illustrated in FIG. 21, which is also a modification of the embodiment illustrated in FIG. 19. In the embodiment of FIG. 21, rather than isolate the passive optical elements mounted atop the optics platform OP, the actively controlled reflector element 250 has been isolated. In particular, the reflector element 250 is attached to a mass 430, which is attached to the optics platform OP by isolation elements 431. In this way, the force of the actuators 255 when making adjustments to the position and/or orientation of the reflector element 250 are applied to the mass 430, and the damper elements 431, reducing the oscillations of the optics platform OP. The mass 430 may be selected such that the resonant frequency of the mass 430 is lower than that of the reflector element 250. In this way, while the reflector element 250, considered in isolation, will have the same resonant frequency, the combined resonant frequency of the reflector element 250 and the mass 430 is advantageously reduced. In some embodiments, the combined resonant frequency of the reflector element 250 and the mass 430 may be reduced to below that of the maximum frequency at which adjustments can be made to the position and/or orientation of the reflector element 250 (i.e. the bandwidth limiting frequency). Additionally, the isolation of the mass 430 from the optics platform OP by way of isolation elements 431 further limits the vibrations transferred from the actuation of the reflector element 450 to the optics platform OP.

While both isolation elements 431 and a mass 430 are provided in FIG. 21, in alternative embodiments the mass 430 may not be present. That is, the reflector element 450 may be isolated from the optics platform by isolating means 430. Similarly, in some embodiments the mass 430 may be directly connected to the optics platform without the isolating elements 431.

In alternative embodiments, isolation of the passive optical elements mounted atop the optics platform OP may be achieved by alteration of the inertia ratio between the optics platform OP and the reflector element 250. For example, the weight of the optics platform OP may be increased to increase the inertia of the optics platform OP so that oscillations of the reflector element 250 have a reduced effect on the optics platform OP. Alternatively, the weight of the reflector element 250 may be reduced. In another alternative embodiment, the reflector element 250 may be mounted directly on the pedestal 421 (or directly on a floor of a room in which the radiation source SO is housed) such that vibrations caused by operation of the actuators 255 are passed directly to the pedestal 421 (or floor) rather than to the optics platform OP. In this way, oscillations of the reflector element 250 will be less strongly coupled with the passive optical elements mounted on the optics platform OP.

In some embodiments of the invention, optical elements (both passive and actively actuable) may be mounted atop the optics platform OP in groups such that movement of each optical element within the group is affected similarly by oscillations of the optical platform OP. Alternatively, optical elements may be mounted atop the optics platform OP such that oscillations which may result in a disturbance in one optical element, result in equal and opposite oscillations of an opposing optical element.

While the embodiments described above with reference to FIGS. 18 to 21 have described separate and distinct techniques for reducing the effect of vibrations caused by actuated components of the radiation source SO on optical components of the radiation source SO, it is to be understood that any combination of the above described techniques may be utilized. Using any combination of the above described techniques, the actuable components of the radiation source SO may be vibrationally isolated from optical components (whether passive or actuable). The actuable components may be isolated at a frequency below that of a frequency at which adjustments may be made to the actuable components. Further, while in the embodiments described above, the actuable component is an actuable reflector (i.e. an optical component), it will be appreciated that where the radiation source SO comprises actuable components which are not optical components (i.e. which do not directly interact with the first radiation source), these maybe vibrationally isolated from the optical components of the radiation source SO that interact with the first amount of radiation.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Although specific reference may have been made above to the radiation source forming part of a lithographic apparatus, it will be appreciated that the radiation source need not be limited to use within a lithographic apparatus. The radiation source may be used as a source of radiation in any appropriate application.

The term "lens," where the context allows, may refer to any one or combination of various types of optical components, including refractive, reflective, magnetic, electromagnetic and electrostatic optical components.

The term "EUV radiation" may be considered to encompass electromagnetic radiation having a wavelength within the range of 5-20 nm, for example within the range of 13-14 nm, or example within the range of 5-10 nm such as 6.7 nm or 6.8 nm.

The term "IR radiation" may be considered to encompass electromagnetic radiation having a wavelength within the range of 0.6 and 500 µm, for example within the range of 1 and 15 µm, for example 10.6 µm.

While specific embodiments of the invention have been described above, It will be appreciated that the invention may be practised otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below.

The invention claimed is:

1. A radiation source suitable for providing a beam of radiation to an illuminator of a lithographic apparatus, the radiation source comprising:
   a nozzle configured to direct a stream of fuel droplets along a trajectory towards a plasma formation location;
   the radiation source configured to receive a first amount of radiation such that the first amount of radiation is incident on a fuel droplet at the plasma formation location;
   the radiation source further comprising an alignment detector having a first sensor arrangement and a second sensor arrangement;
   the first sensor arrangement configured to measure a property of a third amount of radiation that is indicative of a focus position of the first amount of radiation; and
   the second sensor arrangement configured to measure a property of a fourth amount of radiation, the fourth amount of radiation comprising a portion of the first amount of radiation that is reflected by the fuel droplet upon which the first amount of radiation is incident,
   wherein the third amount of radiation and the fourth amount of radiation are coupled out at a same position in a path of the first amount of radiation.

2. The radiation source according to claim 1, wherein the property of the fourth amount of radiation measured by the second sensor arrangement is indicative of a position of the fuel droplet.

3. The radiation source according to claim 1, wherein the alignment detector comprises a beam splitting apparatus, and wherein the radiation source is configured such that at least part of the first amount of radiation is incident on at least part of the beam splitting apparatus;
   the beam splitting apparatus being configured to direct at least a portion of said at least part of the first amount of radiation so that the at least a portion of said at least part of the first amount of radiation is incident on the first sensor arrangement; and
   wherein the at least a portion of said at least part of the first amount of radiation that is directed by the beam splitter apparatus so that it is incident on the first sensor arrangement is the third amount of radiation; and
   wherein the radiation source is configured such that at least part of the fourth amount of radiation is incident on at least part of the beam splitting apparatus;
   the beam splitting apparatus being configured to direct at least a portion of said at least part of the fourth amount of radiation so that the at least a portion of said at least part of the fourth amount of radiation is incident on the second sensor arrangement.

4. The radiation source according to claim 3, wherein the beam splitting apparatus is a beam splitter or comprises a beam splitter.

5. The radiation source according to claim 3, wherein the radiation source is configured such that at a beam splitting position, the beam splitting apparatus both:
   changes a direction of propagation of the at least a portion of the at least part of the first amount of radiation such that the at least a portion of the at least part of the first amount of radiation is incident on the first sensor arrangement; and
   changes a direction of propagation of the at least a portion of the at least part of the fourth amount of radiation such that the at least a portion of the at least part of the fourth amount of radiation is incident on the second sensor arrangement.

6. The radiation source according to claim 1, wherein the radiation source further comprises:
   a secondary radiation source, the secondary radiation source generating the first amount of radiation; and
   a timing controller connected to the secondary radiation source and configured to control the time at which the secondary radiation source generates the first amount of radiation.

7. The radiation source according to claim 6, wherein the alignment detector comprises an alignment radiation source configured to produce the third amount of radiation, wherein the alignment radiation source is mounted to the secondary radiation source such that a propagation direction of the third amount of radiation is substantially parallel to a propagation direction of the first amount of radiation; and
   wherein the radiation source is configured such that at least a part of the third amount of radiation is incident on the first sensor arrangement.

8. The radiation source according to claim 7, wherein the alignment detector comprises a beam splitter apparatus, and wherein the radiation source is configured such that at least part of the fourth amount of radiation is incident on at least part of the beam splitting apparatus; and
   wherein the beam splitting apparatus is configured to direct at least a portion of said at least part of the fourth amount of radiation so that the at least a portion of said at least part of the fourth amount of radiation is incident on the second sensor arrangement.

9. The radiation source according to claim 1, wherein the first sensor arrangement and/or second sensor arrangement comprises a photoelectric sensor array.

10. The radiation source according to claim 1, wherein the plasma formation location is located in a first chamber for containing a vacuum or a gas, and wherein the alignment detector is located outside of the first chamber.

11. The radiation source according to claim 1, wherein the radiation source further comprises a radiation directing device that is configured to direct the first amount of radiation and thereby determine the focus position of the first amount of radiation.

12. The radiation source according to claim 11, wherein the radiation directing device comprises a first directing reflector, at least part of which, in use, is located in the path of the first amount of radiation, and at least one first reflector actuator which is mechanically linked to the first directing reflector, and whereby movement of the at least one first reflector actuator changes the orientation and/or position of the first directing reflector relative to the path of the first amount of radiation.

13. The radiation source according to claim 3, wherein the beam splitting apparatus is located downstream of the first directing reflector with respect to the direction of propagation of the fourth amount of radiation.

14. The radiation source according to claim 3, wherein the beam splitting apparatus is located upstream of the first directing reflector with respect to the direction of propagation of the fourth amount of radiation.

15. The radiation source according to claim 12, wherein the radiation directing device comprises a second directing reflector, at least part of which, in use, is located in the path of the first amount of radiation, and at least one second reflector actuator which is mechanically linked to the second directing reflector, and whereby movement of the at least one second reflector actuator changes the orientation and/or position of the second directing reflector relative to the path of the first amount of radiation.

16. The radiation source according to claim 3, wherein the beam splitting apparatus is located upstream of the second directing reflector with respect to the direction of propagation of the fourth amount of radiation.

17. The radiation source according to claim 1, wherein the nozzle is mechanically linked to at least one nozzle actuator, whereby movement of the at least one nozzle actuator changes the position and/or orientation of the nozzle relative to the remainder of the radiation source, and hence the trajectory of the stream of fuel droplets.

18. The radiation source according to claim 1, wherein the radiation source further comprises a controller, and
   wherein the first sensor arrangement provides a first sensor signal to the controller, the second sensor arrangement provides a second sensor signal to the controller; and
   wherein the controller is configured to control the relative alignment between the fuel droplet and the focus position of the first amount of radiation based on the first and second sensor signals.

19. The radiation source according to claim 18, wherein the controller is configured to control the relative alignment between the fuel droplet and the focus position of the first amount of radiation by controlling at least one of the following based on the first and second sensor signals:
   the position of the nozzle relative to the remainder of the radiation source, and hence the trajectory of the stream of fuel droplets;
   a propagation direction of the first amount of radiation, and hence the focus position of the first amount of radiation; and
   the time at which the first amount of radiation is incident on the fuel droplet.

20. A lithographic apparatus arranged to project a pattern from a patterning device onto a substrate, wherein the lithographic apparatus comprises a radiation source configured to provide a beam of radiation to the patterning device, the radiation source comprising:
   a nozzle configured to direct a stream of fuel droplets along a trajectory towards a plasma formation location; and
   the radiation source configured to receive a first amount of radiation such that, in use, the first amount of radiation is incident on a fuel droplet at the plasma formation location;
   wherein the radiation source further comprises an alignment detector having a first sensor arrangement and a second sensor arrangement,
   wherein the first sensor arrangement is configured to measure a property of a third amount of radiation that is indicative of a focus position of the first amount of radiation, and
   wherein the second sensor arrangement is configured to measure a property of a fourth amount of radiation, the fourth amount of radiation being a portion of the first amount of radiation that is reflected by the fuel droplet upon which the first amount of radiation is incident,
   wherein the third amount of radiation and the fourth amount of radiation are coupled out at a same position in a path of the first amount of radiation.

21. A method of operating a radiation source suitable for providing a beam of radiation to an illuminator of a lithographic apparatus, the radiation source comprising: a nozzle, a controller and an alignment detector having a first sensor arrangement and a second sensor arrangement, the method comprising:

directing a stream of fuel droplets from the nozzle along a trajectory towards a plasma formation location;

directing a first amount of radiation at the fuel droplet such that the first amount of radiation is incident on the fuel droplet at the plasma formation location;

measuring, with the first sensor arrangement, a property of a third amount of radiation that is indicative of a focus position of the first amount of radiation;

measuring, with the second sensor arrangement, a property of a fourth amount of radiation, the fourth amount of radiation being a portion of the first amount of radiation which is reflected by the fuel droplet upon which the first amount of radiation is incident;

providing, by the first sensor arrangement, a first sensor signal to the controller that is indicative of the focus position of the first amount of radiation;

providing, with the second sensor arrangement, a second sensor signal to the controller; and determining, by the controller, the relative alignment between the fuel droplet and focus position of the first amount of radiation based on the first and second sensor signals, wherein the third amount of radiation and the fourth amount of radiation are coupled out at a same position in a path of the first amount of radiation.

22. The method of operating a radiation source according to claim 21, the radiation source further comprising a radiation directing device, a secondary radiation source and a timing controller connected to the secondary radiation source, the method comprising:

generating, with the secondary radiation source, the first amount of radiation;

controlling, with the timing controller, the time at which the secondary radiation source generates the first amount of radiation;

directing, with the radiation directing device, the first amount of radiation and thereby determining the focus position of the first amount of radiation; and controlling, with the controller and based on the first and second sensor signals, the relative alignment between the fuel droplet and the focus position of the first amount of radiation by controlling at least one of:

the position of the nozzle relative to the remainder of the radiation source, and hence the trajectory of the stream of fuel droplets, controlling the radiation directing device and thereby controlling a propagation direction of the first amount of radiation, and hence the focus position of the first amount of radiation, and controlling the timing controller so as to control the time at which the first amount of radiation is incident on the fuel droplet.

23. A method of operating a radiation source suitable for providing a beam of radiation to an illuminator of a lithographic apparatus, the radiation source comprising:

a nozzle, a controller and an alignment detector having a first sensor arrangement, a second sensor arrangement, a third sensor arrangement and a fourth sensor arrangement, the method comprising:

directing a stream of fuel droplets from the nozzle along a trajectory towards a plasma formation location;

directing a first amount of radiation at the fuel droplet such that the first amount of radiation is incident on the fuel droplet at the plasma formation location, and such that the first amount of radiation transfers energy to the fuel droplet to generate a modified fuel distribution;

the first sensor arrangement measuring a property of a third amount of radiation that is indicative of a focus position of the first amount of radiation;

the second sensor arrangement measuring a property of a fourth amount of radiation, the fourth amount of radiation being a portion of the first amount of radiation that is reflected by the fuel droplet upon which the first amount of radiation is incident;

the first sensor arrangement providing a first sensor signal to the controller that is indicative of the focus position of the first amount of radiation;

the second sensor arrangement providing a second sensor signal to the controller;

the controller determining the relative alignment between the fuel droplet and focus position of the first amount of radiation based on the first and second sensor signals;

directing a fifth amount of radiation at the modified fuel distribution such that the fifth amount of radiation is incident on the modified fuel distribution, and such that the fifth amount of radiation transfers energy to the modified fuel distribution to generate a radiation generating plasma that emits a second amount of radiation;

the third sensor arrangement measuring a property of a sixth amount of radiation that is indicative of a focus position of the fifth amount of radiation;

the fourth sensor arrangement measuring a property of a seventh amount of radiation, the seventh amount of radiation being a portion of the fifth amount of radiation that is reflected by the modified fuel distribution upon which the fifth amount of radiation is incident;

the third sensor arrangement providing a third sensor signal to the controller that is indicative of the focus position of the fifth amount of radiation;

the fourth sensor arrangement providing a fourth sensor signal to the controller; and the controller determining the relative alignment between the modified fuel distribution and focus position of the fifth amount of radiation based on the third and fourth sensor signals, wherein the third amount of radiation and the fourth amount of radiation are coupled out at a same position in a path of the first amount of radiation.

24. The method of operating a radiation source according to claim 23, wherein the first and third sensor arrangements are one and the same; and wherein the second and fourth sensor arrangements are one and the same.

25. The method of operating a radiation source according to claim 24, the radiation source further comprising a first radiation directing device, a secondary radiation source and a timing controller connected to the secondary radiation source, the method comprising:

generating, with the secondary radiation source, the first amount of radiation;

controlling, with the timing controller, the time at which the secondary radiation source generates the first amount of radiation;

directing, with the first radiation directing device, the first amount of radiation and thereby determining the focus position of the first amount of radiation; and controlling, with the controller and based on at least one of the first and second sensor signals, the relative alignment between the fuel droplet and the focus position of the first amount of radiation by controlling the radiation directing device and thereby controlling a propagation direction of the first amount of radiation, and hence the focus position of the first amount of radiation.

26. The method of operating a radiation source according to claim 25, the radiation source further comprising a second radiation directing device, a secondary radiation source and a timing controller connected to the secondary radiation source, the method comprising:
generating, with the secondary radiation source, the fifth amount of radiation;
controlling, with the timing controller, the time at which the secondary radiation source generates the fifth amount of radiation;
directing, with the second radiation directing device, the fifth amount of radiation and thereby determining the focus position of the fifth amount of radiation; and
controlling, with the controller and based on at least one of the first and second sensor signals, the relative alignment between the modified fuel distribution and the focus position of the fifth amount of radiation by controlling the radiation directing device and thereby controlling a propagation direction of the fifth amount of radiation, and hence the focus position of the fifth amount of radiation.

27. The method of operating a radiation source according to claim 26, wherein the first and second radiation directing devices are not the same radiation directing device.

28. The method of operating a radiation source according to claim 27, wherein the first amount of radiation is not incident on the second radiation directing device.

29. The method of operating a radiation source according to claim 28, wherein the radiation source further comprises a third radiation directing device, the method further comprising:
directing, with the third radiation directing device, the fifth amount of radiation onto the second radiation directing device; and
wherein said first amount of radiation does not interact with said third radiation directing device.

* * * * *